US006656646B2

(12) United States Patent
Hotta et al.

(10) Patent No.: US 6,656,646 B2
(45) Date of Patent: Dec. 2, 2003

(54) FABRICATION METHOD OF SEMICONDUCTOR INTEGRATED CIRCUIT DEVICE

(75) Inventors: Shoji Hotta, Ome (JP); Norio Hasegawa, Nishitama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/195,399

(22) Filed: Jul. 16, 2002

(65) Prior Publication Data

US 2003/0044721 A1 Mar. 6, 2003

(30) Foreign Application Priority Data

Aug. 31, 2001 (JP) ........................................ 2001-263735

(51) Int. Cl.⁷ ............................... G03F 9/00; G03C 5/00
(52) U.S. Cl. ............................... 430/5; 430/22; 430/30; 430/394; 716/19
(58) Field of Search ............................. 430/5, 22, 30, 430/312, 394; 356/237.4, 237.5, 237.6; 716/19

(56) References Cited

U.S. PATENT DOCUMENTS

| | | | | |
|---|---|---|---|---|
| 4,684,971 A | 8/1987 | Payne | ........................ | 357/42 |
| 5,376,483 A | 12/1994 | Rolfson | ........................ | 430/5 |
| 5,378,585 A | 1/1995 | Watanabe | ........................ | 430/176 |
| 5,389,474 A | 2/1995 | Iguchi et al. | ........................ | 430/5 |
| 5,418,092 A | 5/1995 | Okamoto | ........................ | 430/5 |
| 5,556,724 A | 9/1996 | Tarumoto et al. | ........................ | 430/5 |
| 5,741,613 A | 4/1998 | Moon et al. | ........................ | 430/5 |
| 5,948,572 A | 9/1999 | Liu et al. | ........................ | 430/5 |
| 5,989,760 A | 11/1999 | Mangat et al. | ........................ | 430/22 |
| 6,327,022 B1 * | 12/2001 | Nishi | ........................ | 355/53 |
| 6,346,427 B1 * | 2/2002 | Gardner et al. | ........................ | 438/10 |
| 6,426,168 B1 * | 7/2002 | Johnson | ........................ | 430/30 |
| 2002/0022185 A1 | 2/2002 | Tanaka et al. | ........................ | 430/5 |

FOREIGN PATENT DOCUMENTS

| | | |
|---|---|---|
| JP | 56-30129 | 3/1981 |
| JP | 59-22050 | 2/1984 |
| JP | 5-289307 | 11/1993 |
| JP | 6-19115 | 1/1994 |
| JP | 11-15133 | 1/1999 |
| JP | 2002/23340 | 1/2002 |
| JP | 2002-623634 | 2/2002 |
| JP | 2002-118049 | 4/2002 |
| WO | WO 01/02908 | 1/2001 |
| WO | WO 02/05032 | 1/2002 |
| WO | WO 02/15242 | 2/2002 |

* cited by examiner

*Primary Examiner*—Mark F. Huff
*Assistant Examiner*—Kripa Sagar
(74) *Attorney, Agent, or Firm*—Miles & Stockbridge P.C.

(57) ABSTRACT

A pattern accuracy of a semiconductor integrated circuit device is to be improved. When an ordinary photomask is to be replaced with a resist mask, in setting a planar size of a shielding pattern formed by resist film, a correction quantity L is subtracted from a planar size of a corresponding shielding pattern formed of metal. Conversely, when the resist mask is to be replaced with the ordinary mask, in setting a planar size of the shielding pattern formed of metal, the correction quantity L is added to the planar size of the corresponding shielding pattern formed by resist film.

18 Claims, 16 Drawing Sheets

POSITION (μm)
LIGHT INTENSITY DISTRIBUTION ON WAFER

MASK SIZE (μm)

DOF@0.16 μmL/S

FABRICATION METHOD OF SEMICONDUCTOR INTEGRATED CIRCUIT DEVICE

BACKGROUND OF THE INVENTION

The present invention relates to a fabrication technique for a semiconductor integrated circuit device and more particularly to a technique which is effective in its application to an exposure technique used in a fabrication process for a semiconductor integrated circuit device.

A photomask which the present inventors have studied is a resist mask using a photosensitive organic film (photoresist film) as a shield against exposure light. This photomask can be expected to afford a cost reducing effect because it does not include an etching step for a metallic film such as a chromium film. Besides, there accrues an advantage in point of ensuring a high accuracy of pattern size. Further, the photomask manufacturing TAT can be greatly shortened.

As to the technique of using a photosensitive organic film as a light shield, it is disclosed, for example, in Japanese Published Unexamined Patent Application No. Hei 5(1993)-289307.

Moreover, in Japanese Published Unexamined Patent Application No. Hei 11(1999)-15133 there is disclosed an example of a pattern forming method in which a pattern included in a group of patterns arranged periodically and located at the outermost peripheral position is mask-biased.

In Japanese Published Unexamined Patent Application No. Hei 6(1994)-19115 is disclosed a technique in which there is applied such a mask-bias as minimizes a dimensional variation of resist caused by a focal shift during exposure.

Further, in Japanese Patent Application No. 2000-246506 is disclosed a resist mask reproducing technique.

SUMMARY OF THE INVENTION

However, the present inventors have found out that the above-mentioned exposure techniques using the above resist mask involves the following problems.

If the size of the shield member which is a metallic film such as a chromium film used in an ordinary photomask and that of the shield member used in the above resist mask are set equal to each other, there arises a difference in size between a pattern transferred using the ordinary mask and a pattern transferred using the resist mask.

In the resist mask, the light shielding performance of the photoresist film which constitutes the shield member is inferior to that of such a metallic film as a chromium film and therefore it is necessary that the thickness of the photoresist film be made larger than that of the metallic film. Consequently, a vertical structure of the resist mask becomes larger and there is a fear that the light intensity in an aperture may be decreased under the influence of a waveguide effect. Thus, a decrease in light intensity caused by the waveguide effect is unavoidable. For example, in the case of KrF excimer laser beam with an exposure wavelength $\lambda=248$ nm and in case of optical constants n=2 and k=0.3 of the resist mask being developed by the present inventors, a photoresist film thickness of about 0.45 $\mu$m is needed for obtaining a light shielding performance of 3 in terms of OD value. Using these numerical values, we have checked by calculation the influence of the vertical structure of the resist mask and found that the light intensity transmitted by an aperture decreased. It turned out for the first time by the present inventors that the amount of a dimensional variation caused by such a decrease in light intensity was about 40 nm on the upper surface of a semiconductor wafer. Therefore, if the resist mask is fabricated while setting the shield size equal to that of the ordinary photomask, the light intensity distribution on wafer will become different between the ordinary photomask and the resist mask. In many cases, the mask size is optimized using the ordinary photomask, so the mask size of the resist mask does not correspond to an optimal size. This problem arises in case of changing from the exposure treatment using the resist mask to the same treatment using the ordinary photomask or vice versa.

It is an object of the present invention to provide a technique which can improve the pattern accuracy of a semiconductor integrated circuit device.

The above and other objects and novel features of the present invention will become apparent from the following description and the accompanying drawings.

The following is a brief description of a typical invention disclosed herein.

In replacing a photomask with a shield member formed by a metallic film and a photomask with a shield member formed by a photosensitive organic film from one to the other, the present invention involves the steps of applying a dimensional correction responsive to exposure conditions to the shield member formed by the metallic film or the shield member formed by the photosensitive organic film and performing a reducing projection exposure of predetermined patterns to a wafer using the photomask after the dimensional correction.

DETAILED DESCRIPTION OF THE PREFERRED EMBODIMENTS

Figure 1:
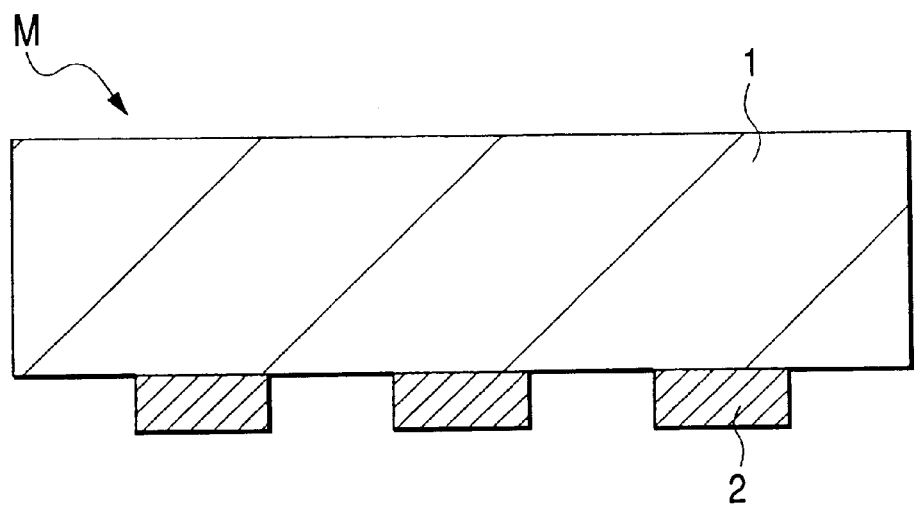
FIG. 1 is a sectional view of a principal portion, showing an example of an ordinary photomask.

Before describing the present invention in detail, the meanings of terms used herein will be explained as follows.

1. By the term "device surface" is meant a main surface of a wafer on which device patterns corresponding to plural chip areas are formed by photolithography.
2. By the term "semiconductor integrated circuit wafer" (semiconductor integrated circuit board) or "wafer" (semiconductor substrate) is meant a silicon single crystal substrate (semiconductor wafer, generally circular in plan), a sapphire substrate, a glass substrate, or any other insulating or semi-insulating semiconductor substrate, or a composite substrate thereof.
3. By the term "masking layer" is meant a resist film, including an inorganic mask and a non-photosensitive organic mask.
4. By the terms "shielding area," "shielding film," and "shielding pattern" is meant that they possess an optical characteristic of transmitting less than 40% of exposure light radiated to the area concerned. Generally used are those whose exposure light transmittance is in the range from several percent to 30%. Particularly, in the case of a binary mask (or a binary shielding pattern) which is used as an alternative to the conventional chromium mask, the light transmittance in its shielding area is approximately zero, i.e., less than 1%, preferably less than 0.5%, more practically less than 0.1%. On the other hand, by the terms "transparent" and "transparent film" is meant to possess an optical characteristic of transmitting 60% or more, generally 90% or more, of exposure light radiated to the area concerned.
5. By the term "photoresist pattern" is meant a film pattern obtained by patterning a photosensitive organic film in accordance with a photolithographic technique. This pattern includes a mere photoresist film having no aperture in the portion concerned.
6. In the semiconductor field, ultraviolet rays are classified into ultraviolet rays shorter than about 400 nm and not shorter than about 50 nm in wavelength, near ultraviolet rays not shorter than 300 nm in wavelength, far ultraviolet rays shorter than 300 nm and not shorter than 200 nm in wavelength, and vacuum ultraviolet rays shorter than 200 nm in wavelength. Although principal embodiments of the present invention refer mainly to a far ultraviolet region using a KrF excimer laser, the principle of the present invention is also applicable to short wavelength end regions of vacuum ultraviolet rays shorter than 200 nm and ultraviolet rays shorter than 100 nm and not shorter than 50 nm.
7. By the term "metal" referred to in connection with the mask shield material is meant chromium, chromium oxide, or any of other similar compounds of metals. Examples thereof include simple substances, including metal elements, as well as compounds and composites, all of which exhibit a light shielding action.
8. By the term "ordinary photomask (metal mask or chromium mask)" is meant an ordinary mask wherein mask patterns are formed by both metallic shielding patterns and light transmitting patterns on a mask substrate. The ordinary pattern will also be referred to hereinafter merely as "mask."
9. By the term "resist mask" is meant a mask generally obtained by exposing a photosensitive resist-based film to an energy beam such as electron beam (ion beam) or light (ultraviolet light such as vacuum UV, far UV, or near UV, or visible light) or by exposing it to light in accordance with the technique of photolithography, to effect patterning. The shielding film is required to shield the whole or part of ultraviolet rays such as vacuum UV, far UV, and near UV, and visible light. The photosensitivity is an attribute of the above resin itself, provided a light absorbing agent and a light scattering material may be added if necessary. It is here assumed that an emulsion mask or the like wherein an additive composition comprising silver halide as a main photosensitive component does not correspond to the resist mask as referred to herein. That is, the film material should be a material which possesses a light shielding property already before development or already at the time when applied onto a mask substrate, not a material that exhibits a desired light shielding property for the first time upon development. However, it goes without saying that various additives, including the materials just referred to above, may be contained. The resist generally contains an organic resin as a principal resin component, but an organic material may be added.

10. By the term "halftone mask" is meant a mask having a halftone shifter wherein the transmittance of a halftone film, a kind of a phase shift mask, serving as both a shifter and a light shielding film is not less than 1% and less than 40% (preferably less than 20%) and wherein the phase shift quantity, as compared with that of a portion free from the halftone film, inverts the phase of light (a phase difference takes a mutually weakening value by mutual interference, with no limitation made to a completely inverted phase, but even an incompletely inverted phase will do insofar as at least mutual strengthening is not observed).

11. By the term "Levenson type phase shift mask" is meant a kind of a phase shift mask wherein the phases of apertures adjacent to each other through a shielding area are mutually inverted and it is intended to obtain a clear image by the resulting interference action.

12. The term "semiconductor integrated circuit device" as referred to herein includes not only those fabricated on such a semiconductor or insulator substrate as silicon wafer or sapphire substrate but also those formed on other insulating substrates such as glass substrates, e.g., TFT (Thin-Film-Transistor) and STN (Super-Twisted-Nematic) liquid crystal, unless otherwise specified.

13. By the term "hole pattern" is meant a fine pattern, such as contact holes and through holes, having a two-dimensional size equal to or smaller than the exposure light wavelength on a wafer. On a mask, the hole pattern generally assumes a square shape or a rectangular shape similar thereto or an octagon shape, but on a wafer it many cases assumes a shape close to a circular shape.

14. By the term "line pattern" is meant a band-like pattern which forms a wiring line or the like on a wafer.

The following embodiments will be described dividedly into plural sections or embodiments where required for the sake of convenience, but unless otherwise mentioned it is to be understood that they are not unrelated to each other, but one is in a relation of modification or detailed or supplementary explanation of part or the whole of the other.

When reference is made to, for example, the number of elements (including the number of pieces, numerical value, quantity, and range) in the following embodiments, no limitation is made to the specified number, but numbers above and below the specified number will do unless otherwise specified and except the case where limitation is made to the specified number basically clearly.

In the following embodiments, moreover, it goes without saying that their components (including constituent steps) are not always essential unless otherwise mentioned and except the case where they are considered essential basically clearly.

Likewise, in the following embodiments, it is to be understood that when reference is made to the shape and positional relation of a component, those substantially similar or closely similar thereto are also included unless otherwise mentioned and except the case where the answer is negative basically clearly. This is also true of the foregoing numerical value and range.

In all of the drawings for illustrating the embodiments, portions having the same functions are identified by like reference numerals and repeated explanations thereof will be omitted.

Further, in the drawings used in the embodiments, even plan views may be hatched to make them easier to see.

Embodiments of the present invention will be described in detail hereinunder with reference to the accompanying drawings.

First Embodiment

FIG. 1 is a sectional view of a principal portion, showing an example of the foregoing ordinary mask (a first photomask) indicated at M. A mask substrate 1 which constitutes the mask M is formed, for example, by a synthetic quartz glass sheet which is transparent to exposure light, with shielding patterns (shield members) 2 being formed on a main surface (first surface) of the mask substrate. The shielding patterns 2 are formed of a metallic material having a shielding property against exposure light. For example, it is a laminate film comprising chromium (Cr) and chromium oxide (CrO) deposited thereof or a laminate film comprising chromium oxide-chromium-chromium oxide deposited in this order.

Figure 2:
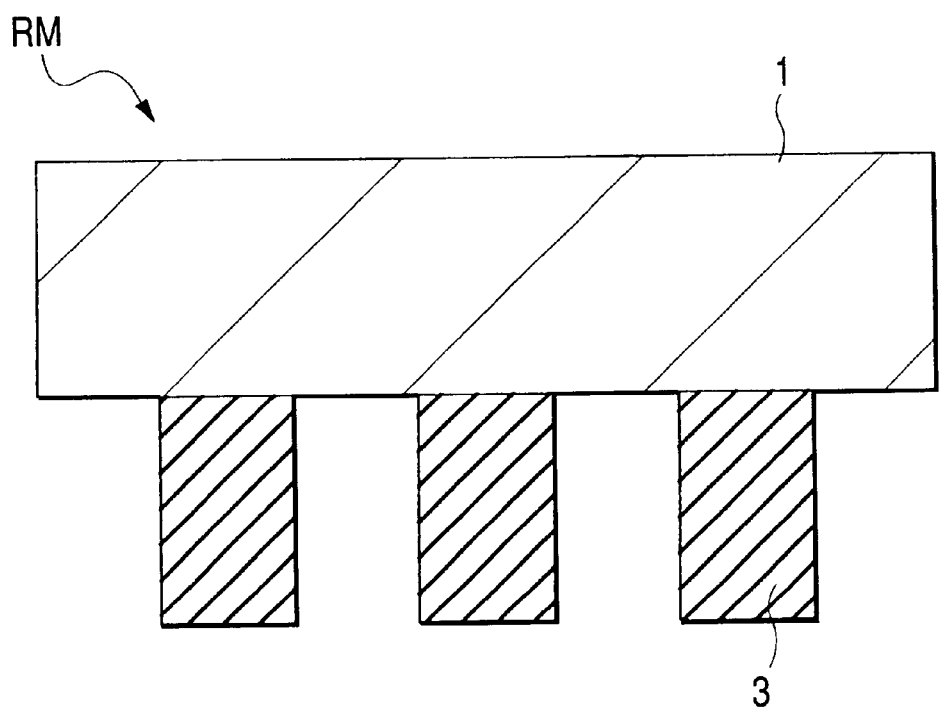
FIG. 2 is a sectional view of a principal portion, showing an example of a resist mask.

On the other hand, FIG. 2 is a sectional view of a principal portion, showing an example of the foregoing resist mask (a second photomask) RM. In both figures, patterns which are transferred onto a wafer using the ordinary mask M of FIG. 1 and patterns which are transferred onto a wafer using the resist mask RM of FIG. 2, are the same in design. In the resist mask RM, shielding patterns (shield members) 3 are formed on the main surface (first surface) of the mask substrate 1. The shielding patterns 3 are each formed, for example, by a photosensitive organic film (photoresist film, simply "resist film" hereinafter) having a shielding property against exposure light such as KrF excimer laser beam (wavelength 248 nm), ArF excimer laser beam (wavelength 193 nm), or $F^2$ laser beam (wavelength 157 nm). As materials of the resist film there were used those containing, as main components, α-methylstyrene/α-chloroacrylic acid copolymer, novolak resin/quinonediazide, novolak resin/polymethylpentene-1-sulfone, and chloromethylated polystyrene. There also may be used what is called a chemical amplification type resist obtained by mixing a phenolic resin or novolak resin such as polyvinyl phenolic resin with an inhibitor and an acid generator. The material of the resist film to be used is required to possess a light shielding characteristic against a light source in a projection aligner or exposure unit and is required to be sensitive to light from a light source of a pattern plotter, e.g., electron beam or light having a wavelength of 230 nm or more. No limitation is made to the foregoing materials, but various changes may be made. It is sometimes desirable to use a negative type resist film as the resist film for forming the shielding patterns 3 of the resist mask. More particularly, in the resist mask RM, if the resist film is allowed to remain outside a transfer pattern area of the mask substrate 1, it will cause contamination, so it is necessary to remove the outside resist film. If a positive type resist film is used, it is necessary to perform electron beam plotting also for most of the outer periphery portion of the transfer pattern area, but this is time-consuming. In contrast therewith, if a negative type resist film is used, it is possible to reduce the resist film plotting area and shorten the plotting time and hence possible to fabricate the resist mask RM at a Q-TAT (Quick Turn Around Time). As to the resist mask, a related description is found in Japanese Patent Application No. Hei 11-185221 (filed Jun. 30, 1999) which includes an inventor in the present case.

In an exposure process, the ordinary mask M or the resist mask RM is set to a reducing projection exposure unit (stepper or scanner) so that its main surface (first surface) faces a reducing projection lens. Exposure light is emitted from a back side (the side where the shielding patterns 2 and 3 are not formed, i.e., a second surface) of the ordinary mask M or the resist mask RM and is radiated to the resist film on the wafer through the ordinary mask M or the resist mask RM and further through the reducing projection lens. At this time, the mask patterns of the ordinary mask M or the resist mask RM are reduced by the reducing projection lens and are focused on the resist film on the wafer, whereby the patterns are transferred onto the resist film.

For example, in case of using a KrF excimer laser beam having a wavelength of 0.248 pm as the exposure light, a satisfactory light shielding property can be obtained at a thickness of, for example, 0.1 pm or so of each shielding pattern 2 of the ordinary mask M. On the other hand, in the resist mask RM, the light shielding performance of the resist film which forms the shielding patterns 3 is inferior to that of the shielding patterns 2 formed by a metallic material, so it is necessary that the shielding patterns 3 of the resist mask RM be made thicker than the shielding patterns 2 of the ordinary mask M by, for example, 0.45 pm or so (for a thickness able to afford a light shielding property of 0.1% and an OD value of 3, with optical constants n=2 and k=3). However, the present inventors found out for the first time that such a difference would cause the following problem.

Figure 3:
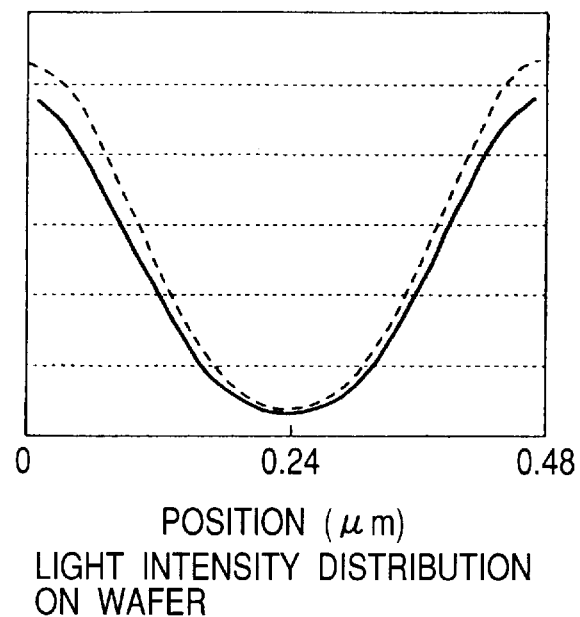
FIG. 3 is a graph showing an example of having calculated a light intensity distribution on wafer in case of a resist mask shield pattern being, for example, 0.46 $\mu$m in thickness.

FIG. 3 shows an example of having calculated a light intensity distribution on wafer in case of the shielding patterns 3 being each, for example, 0.46 $\mu$m thick, using KrF excimer laser beam having an exposure light wavelength (simply "$\lambda$" hereinafter) of 0.248 $\mu$m, a reduction ratio in the exposure unit of 4, a lens numerical aperture (simply "NA" hereinafter) in the exposure unit of 0.68, a Sigma value (also simply as "$\sigma$" hereinafter) of 0.75, and a line-and-space (simply "L/S" hereinafter) of 0.24 $\mu$m of the patterns to be exposed in terms of a size on wafer. In the same figure, a solid line represents a light intensity distribution in case of using the resist mask and a broken line represents a light intensity distribution in case of using the ordinary mask. A look at FIG. 3 shows that the light intensity distribution of the ordinary mask H and that of the resist mask RM are different from each other and that the resist mask is lower in the aperture light intensity on the mask substrate. It is seen that in case of transferring patterns onto the positive type resist film on wafer, the resist mask affords a larger line width under the condition of exposure quantity being the same. This is because a different in height of each side wall of each shielding pattern 3 formed by the resist film is large and therefore the light intensity is lowered by a waveguide effect in the vicinity of the side wall.

Figure 4:
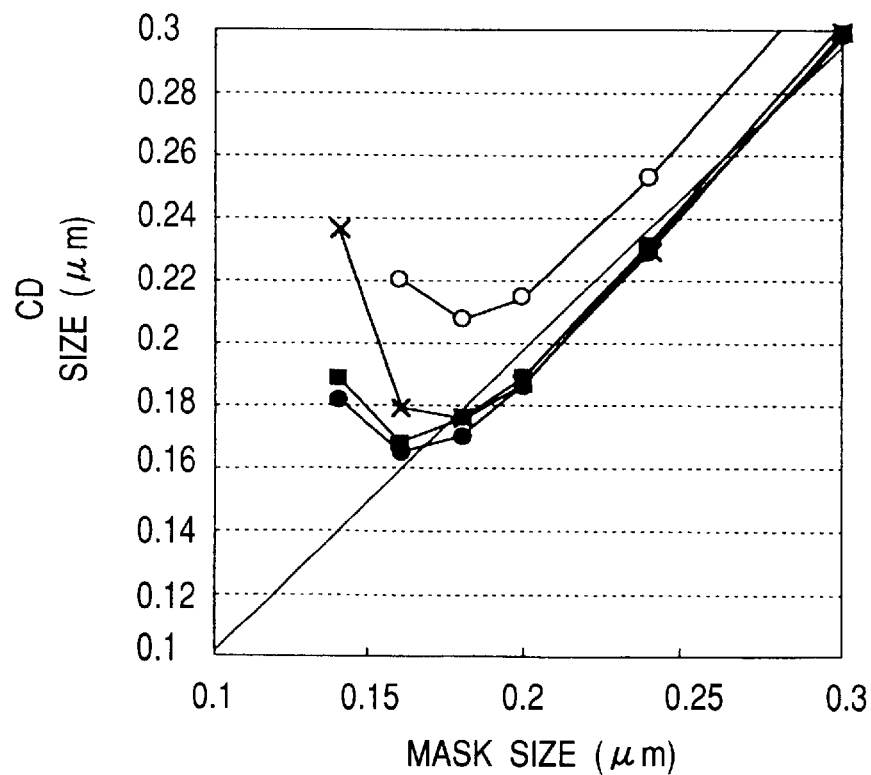
FIG. 4 is a graph showing pattern size calculation results on wafer with varying pattern sizes on a mask substrate with respect to both ordinary photomask and resist mask.

Also in the case of the resist mask, desired patterns can be formed on the wafer by adjusting the exposure light, but in this case there is the possibility that the resolution and the process margin will be deteriorated. An example thereof is given in FIG. 4. FIG. 4 shows pattern size calculation results on wafer with varying pattern sizes on a mask substrate. Exposure conditions adopted involve KrF excimer laser beam of $\lambda$=0.248 $\mu$m, NA=0.68, $\sigma$=0.75, an exposure unit reduction ratio of 4, and a positive resist film as the resist film on wafer. In FIG. 4, black marks represent calculation results obtained using the ordinary mask (slice level (threshold value, simply as "Ith" hereinafter)=0.296), while the other marks represent calculation results obtained using the resist mask. More specifically, as to the resist mask, there are shown (1) a case where the exposure quantity was set at the same value as for the ordinary mask (white circle, Ith=0.296), (2) a case where the exposure quantity was adjusted so that a 0.3 $\mu$m L/S pattern on the resist mask was processed into 0.3 $\mu$m L/S on wafer (cross mark, Ith=0.246), and (3) a case where a correction was made so as to reduce the size of shielding patterns (resist film) on the mask uniformly only 10 nm on each side in terms of size on the wafer (40 nm on each side in terms of size on the mask substrate), while the exposure quantity was set at the same value as in the use of the ordinary mask (black square, Ith=0.296). Adjusting the exposure quantity is equivalent to changing the Ith of light intensity distribution. In FIG. 4, Ith is changed.

From FIG. 4 resulting from studies made by the present inventors it is seen that the use of the resist mask (the above case (1)) results in a larger line size and deteriorated resolving performance in comparison with the use of the ordinary mask, under the condition of the exposure quantity being the same. On the other hand, even in the case where the exposure quantity was adjusted for the resist mask (the above (2)), it is seen that at a mask size of not larger than 0.18 $\mu$m the resolving performance is inferior to that in the use of the ordinary mask. However, if the shielding pattern size on the resist mask is subjected to a dimensional correction of about 10 mm on each side uniformly without depending on pattern size (a correction toward a smaller dimension than metallic shielding patterns) and the exposure quantity is set equal to that for the ordinary mask, it is possible to obtain a resolving performance almost equal to that in the ordinary mask. This is because by correcting the shielding pattern size on the resist mask it is made possible to make the light distribution itself equal to that in the use of the ordinary mask.

Referring now to FIGS. 5 to 8, there are shown results of having calculated focus tolerance (simply "DOF" hereinafter) and optical image contrast with the dimensional correction added for the shielding patterns.

Figure 5:
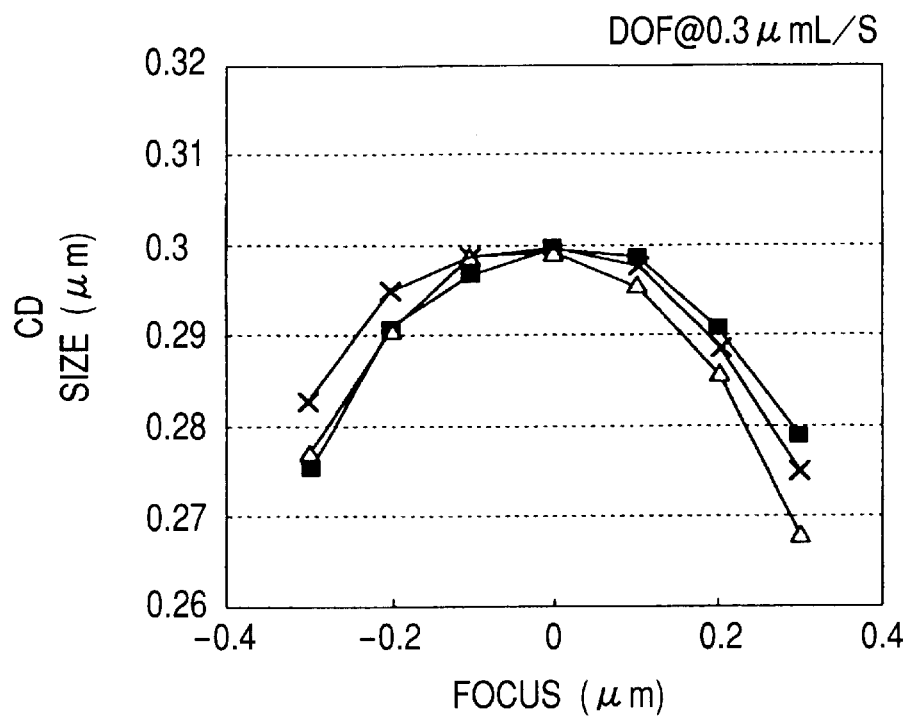
FIG. 5 is a graph showing a comparison between the ordinary photomask and the resist mask with respect to a focus tolerance.
Figure 6:
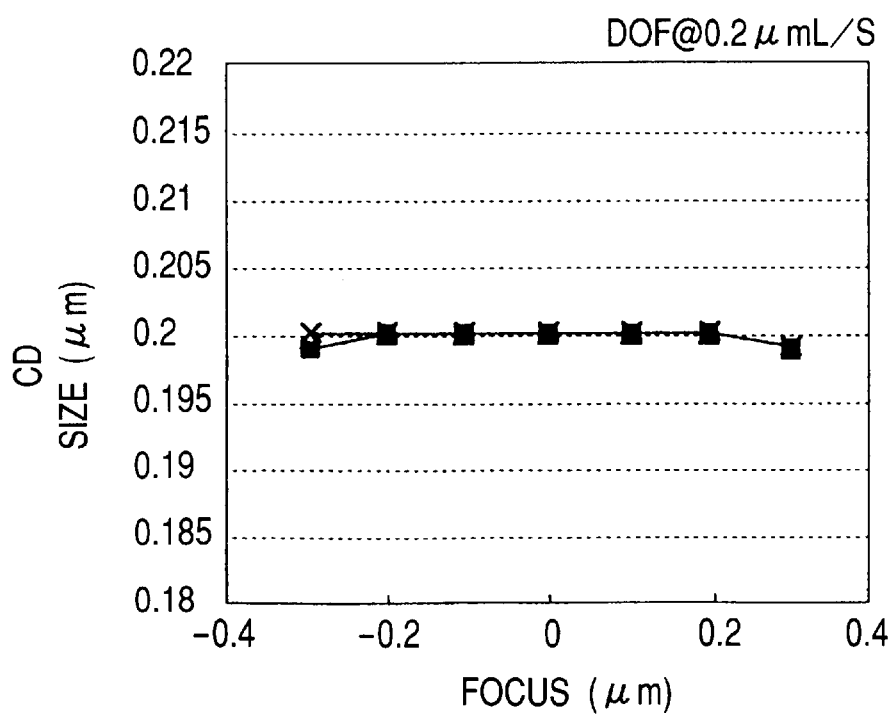
FIG. 6 is a graph showing a comparison between the ordinary photomask and the resist mask with respect to a focus tolerance.
Figure 7:
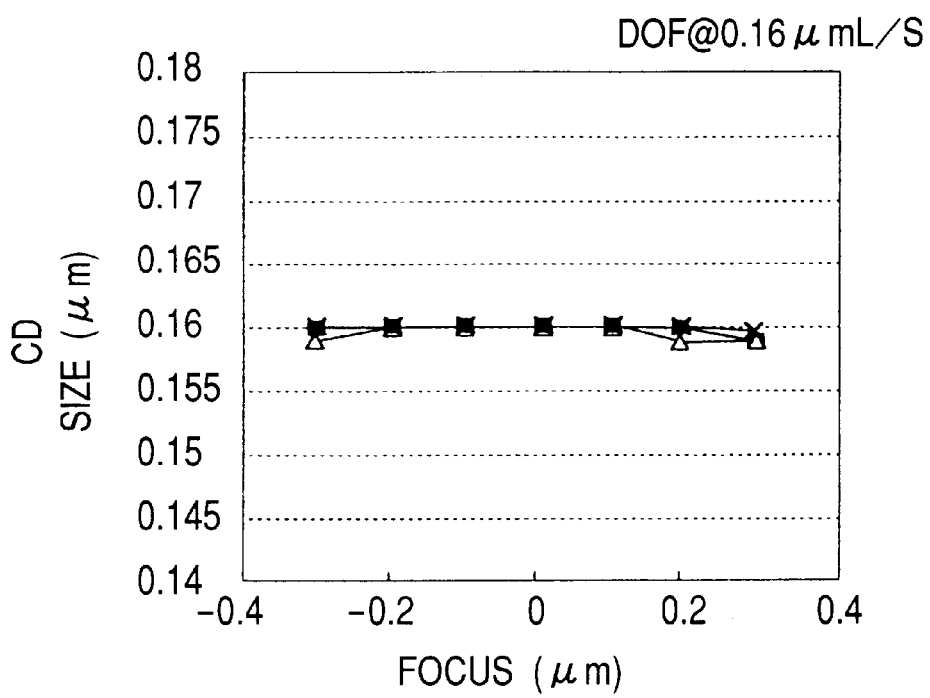
FIG. 7 is a graph showing a comparison between the ordinary photomask and the resist mask with respect to a focus tolerance.
Figure 8:
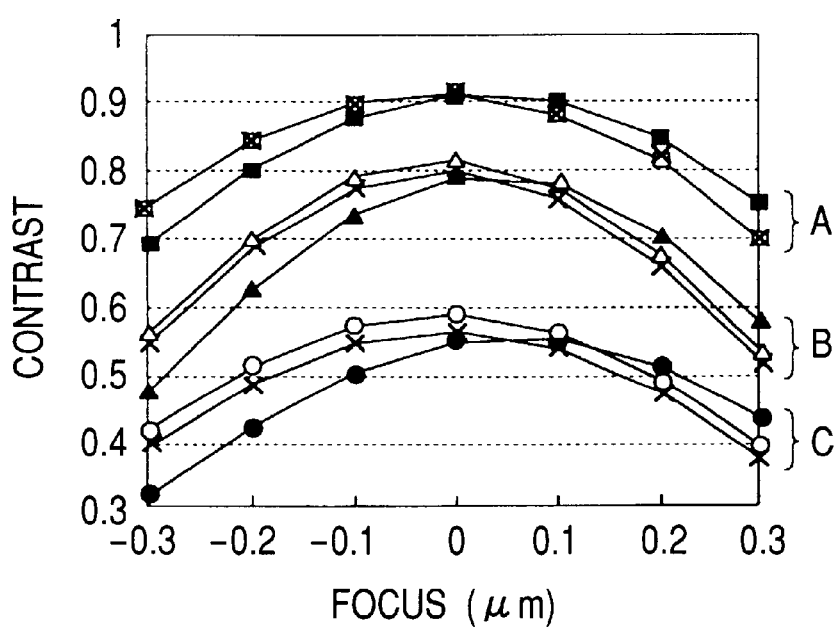
FIG. 8 is a graph showing a comparison between the ordinary photomask and the resist mask with respect to contrast.

Exposure conditions here adopted are the same as those described above in connection with FIG. 4. FIGS. 5 to 7 show DOFs of 0.3 $\mu$m L/S, 0.2 $\mu$m L/S, and 0.16 $\mu$m L/S, respectively. In these figures, black squares each represent a measurement point in the use of the ordinary mask, white triangles each represent a measurement point in the use of the resist mask (with the dimensional correction not added), and cross marks each represent a measurement point in the use of the resist mask (with the dimensional correction added). FIG. 8 shows a focus-contrast relation. In the same figure, black squares, triangles and circles represent measurement points in the use of the ordinary mask, while white squares, triangles and circles represent measurement points in the use of the resist mask with the dimensional correction not added, further, cross marks represent measurement marks in the use of the resist mask with the dimensional correction added. Likewise, black and white squares, black and white triangles, and black and white circles, represent transfers of 0.3 $\mu$m L/S, 0.2 $\mu$m L/S, and 0.16 $\mu$m L/S, respectively. Further, cross marks in measurement groups A, B, and C represent transfers of 0.3 $\mu$m L/S, 0.2 $\mu$m L/S, and 0.16 $\mu$m L/S, respectively.

Reference to FIGS. 5 to 8 shows that for example in all the cases of 0.3 $\mu$m L/S, 0.2 $\mu$m L/S, and 0.16 $\mu$m L/S there can be obtained about the same DOF and optical image contrast as in the use of the ordinary mask by correcting the size of the shielding patterns on the resist mask.

Figure 9:
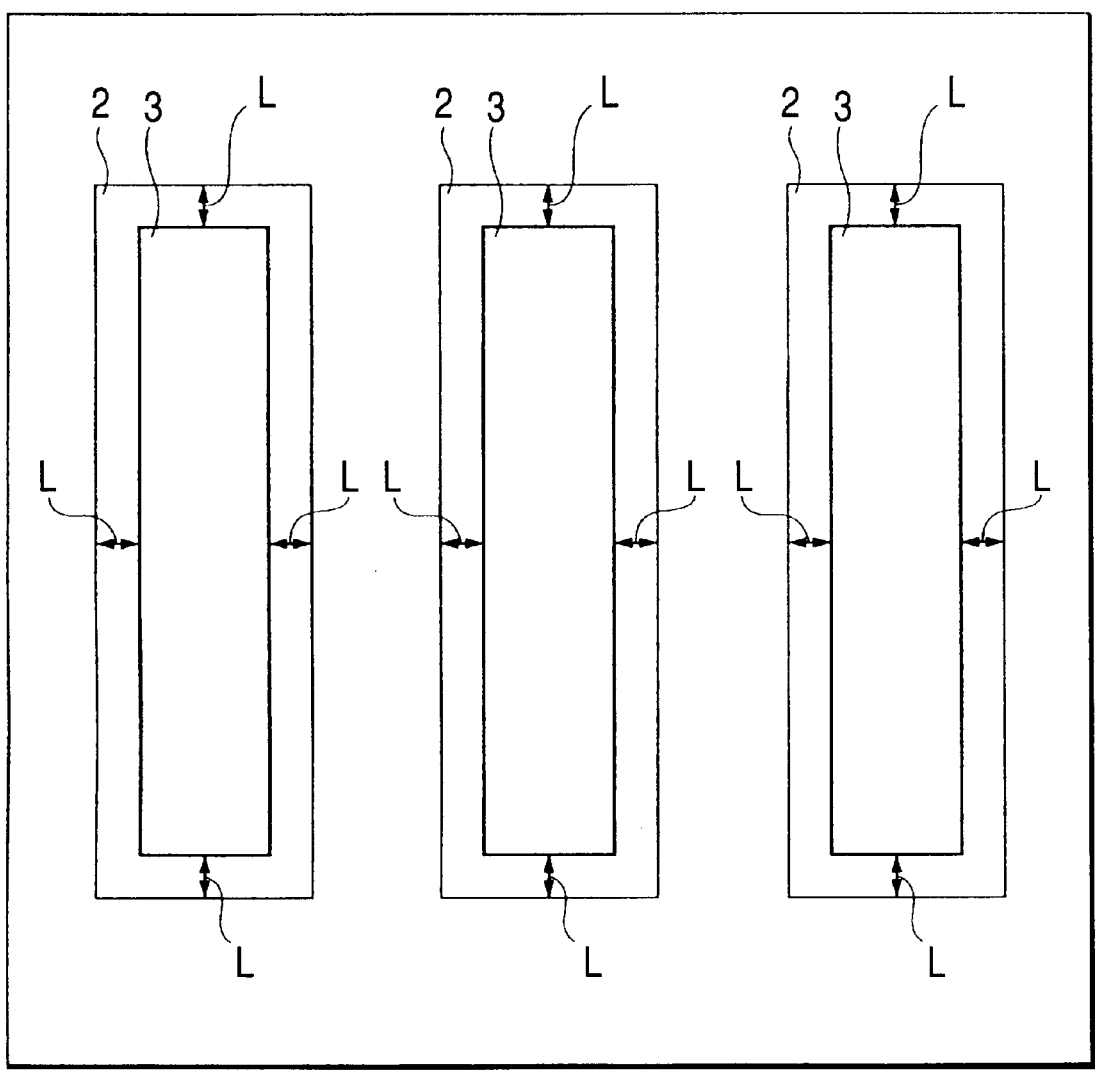
FIG. 9 is an explanatory diagram showing schematically an example of a basic dimensional correction for a photomask used in a semiconductor integrated circuit device fabricating method according to an embodiment of the present invention.

FIG. 9 shows schematically an example of a basic dimensional correction in this embodiment. In the same figure, for making the foregoing dimensional correction easier to understand, data on shielding patterns (both patterns 2 and 3 illustrated are assumed to function as the foregoing binary shielding patterns) in the ordinary mask and the resist mask, which are used for example for the transfer of simple L/S patterns onto a wafer, are represented in an overlapped manner. In case of replacing the ordinary mask with the resist mask, a correction quantity L is subtracted uniformly from the outer periphery of each shielding pattern 2. That is, the shielding patterns 2 are thinned into the shielding patterns 3. On the other hand, in case of replacing the resist mask with the ordinary mask, the correction quantity L is added uniformly to the outer periphery of each shielding pattern 3. That is, the shielding patterns 3 are thickened into the shielding patterns 2. In FIG. 9, however, for the simplification of explanation, there is shown only the correction quantity L which is for correcting a dimensional variation caused by the resist mask. In the case of the ordinary mask, there arises a dimensional shift by etching at the time of etching metal to form the shielding patterns 2. Therefore, it is necessary to add a correction quantity taking the dimensional shift into account. Thus, in case of replacing the resist mask with the ordinary mask, it is actually necessary that a correction quantity taking a countermeasure to etching into account be added uniformly to the outer periphery of each shielding pattern shown in FIG. 9. In case of replacing the ordinary mask with the resist mask, there is no etching process, not giving rise to the foregoing undercut problem, so it is not necessary to add a correction quantity as a countermeasure.

Although in FIGS. 4 to 9 referred to above the shielding pattern size correction quantity was set at 10 nm on each side uniformly without depending on the pattern size, this correction size depends on such exposure conditions as exposure light wavelength, optical constants (n, k) of shielding patterns (resist film), thickness d of shielding patterns (resist film), pattern shape and pattern size. In the case of such a simple pattern as L/S with a relatively large size, a uniform correction will do without depending on pattern size and shape, but generally the correction quantity depends on n, k, d, pattern size (D), pattern shape (M), and lighting conditions (NA, σ) of the exposure unit used, and the correction quantity (L) can be written as (L)=f (n, k, d, D, H, NA, σ, . . . ). It is the light intensity distribution, not the mask size, that is optimized from the standpoint of resolving performance and process margin. For obtaining the same light intensity distribution there is a dimensional difference of shielding patterns between the use of the ordinary mask and the use of the resist mask. By correcting the said difference it becomes possible to replace the ordinary mask and the resist mask from one to the other (there are two cases involving replacement of the ordinary mask with the resist mask and replacement of the resist mask with the ordinary mask). Although the ordinary mask and the resist mask have been compared in the description given above, this description is also applicable to the comparison between an ordinary phase shift mask, such as halftone mask and Levenson mask, and a phase shift mask with shielding patterns constituted by resist film.

Figure 10:
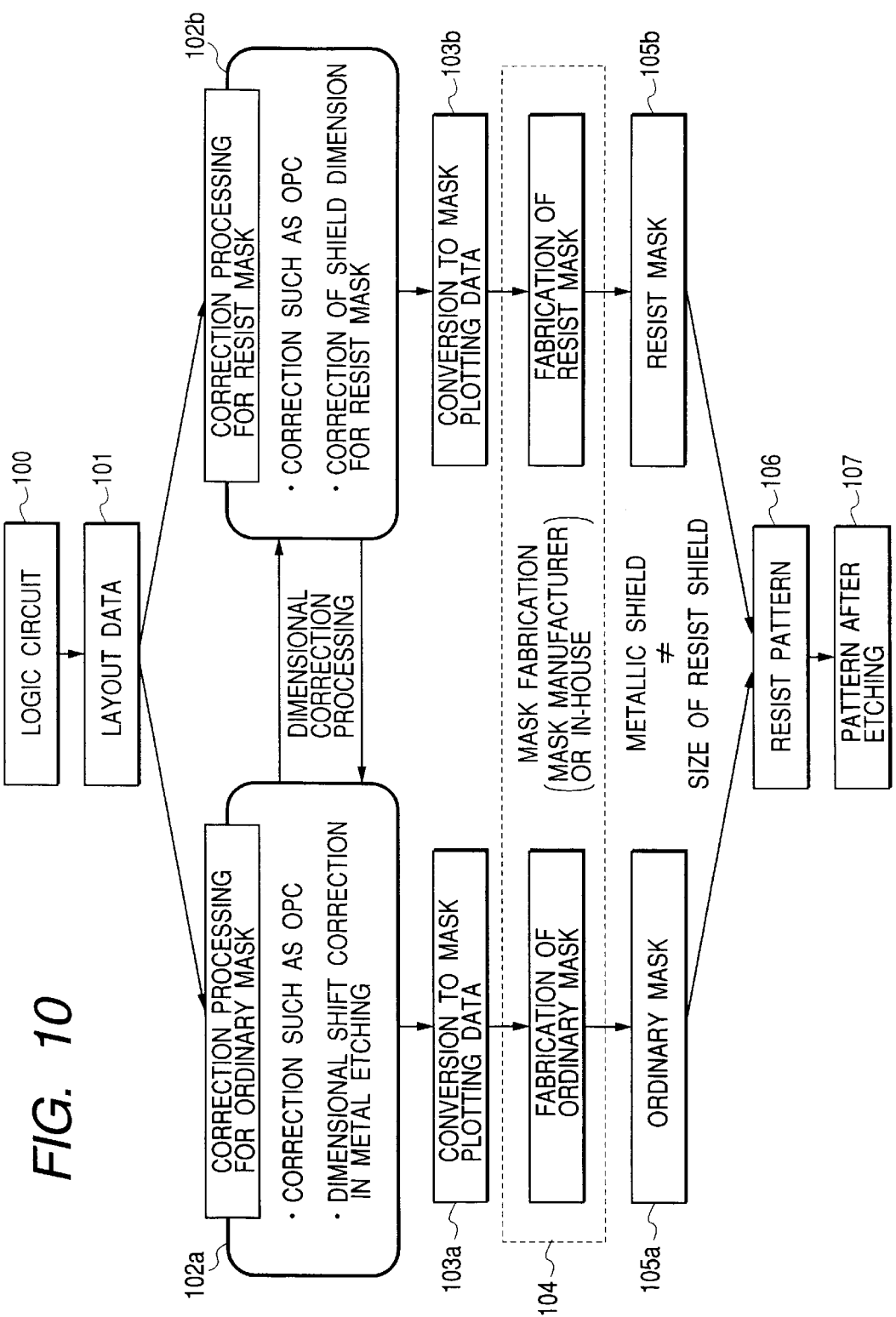
FIG. 10 is an explanatory diagram showing a comparison between the ordinary photomask and the resist mask from a data handling angle in the semiconductor integrated circuit device fabricating method.

Referring now to FIG. 10, there is shown a comparison between the ordinary mask and the resist mask from a data handling angle.

First, layout data is generated from logical circuit data (steps 100 and 101). Then, if necessary, a correction such as OPC (Optical Proximity Correction) is made for the layout data (steps 102a and 102b). Subsequently, this data is converted to mask plotting data (steps 103a and 103b). In the course of these steps, the foregoing dimensional correction for the shielding patterns formed by resist film is added in the case of the resist mask, while in the case of the ordinary mask there is added the dimensional correction in etching which is for forming the metallic shielding patterns (steps 102a and 102b). Thus, data for the ordinary mask and data for the resist mask are different. Although a comparison with the ordinary mask is here mentioned, in the case of the halftone mask, a dimensional correction applied at the time of etching a halftone film formed of molybdenum silicide ($MOS_2$) or chromium fluoride (CrF) for example is added in place of the dimensional shift applied at the time of metal etching. On the other hand, in the case of the resist mask, the dimensional shift correction in etching is not necessary because there is no etching step. The fabrication of mask is in many cases entrusted to a mask manufacturer. In this case, mask plotting data is sent to the mask manufacturer (step 104). The fabrication of mask is sometimes performed in a device manufacturer (a manufacturer of a semiconductor integrated circuit device). In this way the ordinary mask and the resist mask are fabricated by a mask manufacturer or a device manufacturer (steps 105a and 105b). Next, a wafer is subjected to an exposure process using the thus-fabricated ordinary mask and resist mask, thereby transferring patterns to the resist film on the wafer (step 106). The fabricated ordinary mask and resist mask are different in the sizes of respective shielding patterns even if the transfer is of the same device patterns. However, the light intensity distribution obtained by exposure in the use of the ordinary mask and that in the use of the resist mask are almost the same, and the sizes of resist patterns transferred onto the wafer are also about the same between the two. Thereafter, with the resist patterns transferred onto the wafer as etching masks, the base film is etched to obtain desired patterns. Alternatively, with the resist patterns transferred onto the wafer as masks for ion implantation, a predetermined impurity is introduced into the wafer (step 107). Although the ordinary mask and the resist mask are here compared with each other, the same description is also true of such a phase shift mask as halftone mask and Levenson mask.

Figure 11:
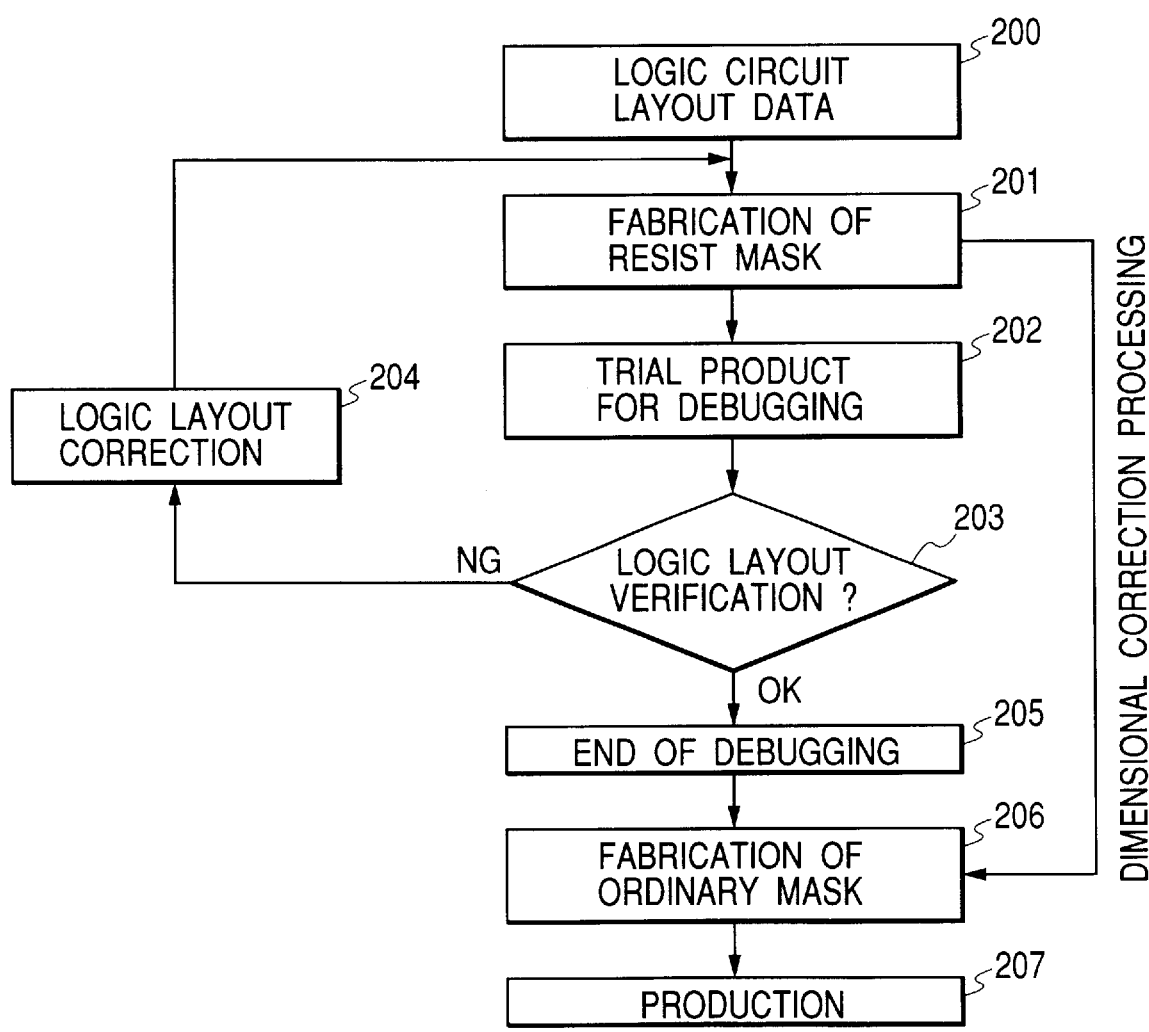
FIG. 11 is an explanatory diagram showing an example of how to use each of the ordinary photomask and the resist mask property in logical verification of the semiconductor integrated circuit device in the fabricating method for the device.

Referring now to FIG. 11, there is shown an example of logical verification of a semiconductor integrated circuit device (simply as "LSI" (Large Scale Integrated Circuit) hereinafter), i.e., an example of how to use the ordinary mask and the resist mask properly and selectively. It is also the ordinary mask that is here illustrated, provided the same description also applies to such phase shift masks as halftone mask and Levenson mask.

First, in the same manner as above, layout data is generated from logical circuit data and thereafter mask plotting data is generated on the basis of the layout data (step 200). Then, a resist mask is fabricated in accordance with the mask plotting data (step 201) and, using the resist mask, a trial product (LSI) for debugging is actually produced using the resist mask (step 202). Thereafter, logic and layout of the trial product for debugging are verified (step 203). If the result of the verification is rejection, the logic and layout are corrected (step 204) and a resist mask is again fabricated in accordance with the corrected data. Using the resist mask thus re-fabricated, the same steps 202 and 203 as above are carried out. Then, if the verification result in step 203 is passing, the debug is completed (step 205). If the verification result is not passing, the above steps are repeated.

After the completion of debugging, an ordinary mask is fabricated using mask plotting data of the passed resist mask (step 206). For replacement between the ordinary mask and the resist mask there is performed the foregoing dimensional correction. Here there is performed such a correction as enlarges (thickens) the size of each shielding pattern formed by the resist film of the resist mask to generate data on each metallic shielding pattern of the ordinary mask. Thereafter, LSIs are mass-produced by an exposure process using the ordinary mask (step 207).

Thus, usually at the initial stage of development of LSI it is necessary to verify the logic circuit used, and if the logic involves any inconvenience, there are performed logic correction and mask correction. Therefore, until completion of the logic verification there is repeated a trial manufacture in a small lot. Thus, at the beginning of the development, both low cost and Q-TAT (Quick Turn Around Time) can be realized by the application of the resist mask.

After debugging is completed with the resist mask as above, a shift is made to the production process. In the case where the production quantity is large, a change to the ordinary mask which is advantageous in point of exposure irradiation resistance is in many cases advantageous in production development. For replacing the resist mask with the ordinary mask it is necessary to make the foregoing dimensional correction. Conversely, by making this correction, a light intensity distribution equal to that obtained by the exposure process using the resist mask can be obtained also by the exposure process using the ordinary mask, thus making mass-production using the ordinary mask possible.

According to another example, a part or the whole of a conventional product developed using the ordinary mask is incorporated as IP (Intellectual Property) into another product. If the product developed is a small-lot product such as system LSI, the application of the resist mask is considered. In this case, if a change is made from the ordinary mask to the resist mask, the foregoing dimensional correction (a correction for reducing the size) is added. With this dimensional correction added, it becomes possible to incorporate the conventional product into another product in a short time.

In the same integrated circuit device, also when a predetermined layer (a layer with patterns substantially established such as an active area and gate electrodes; a first layer) uses the ordinary mask for the transfer of patterns, while another layer (a layer with patterns not established yet such as a wiring layer and apt to undergo a change or modification (especially a custom product); a second layer) uses the resist mask for the transfer of patterns, shielding patterns 3 formed by resist film of the resist mask are subjected to the foregoing dimensional correction (a size reducing correction) with respect to data on metallic shielding patterns 2 (usually shielding patterns 2 formed by a metallic film to be used at the time of transferring patterns of another layer) corresponding to the shielding patterns 3.

Regarding how to use the ordinary mask and the resist mask properly and selectively, related descriptions are found, for example, in Japanese Patent Application Nos. 2000-308320 (filed Oct. 6, 2000) and 2000-246466 (filed Aug. 15, 2000).

Second Embodiment

Figure 12:
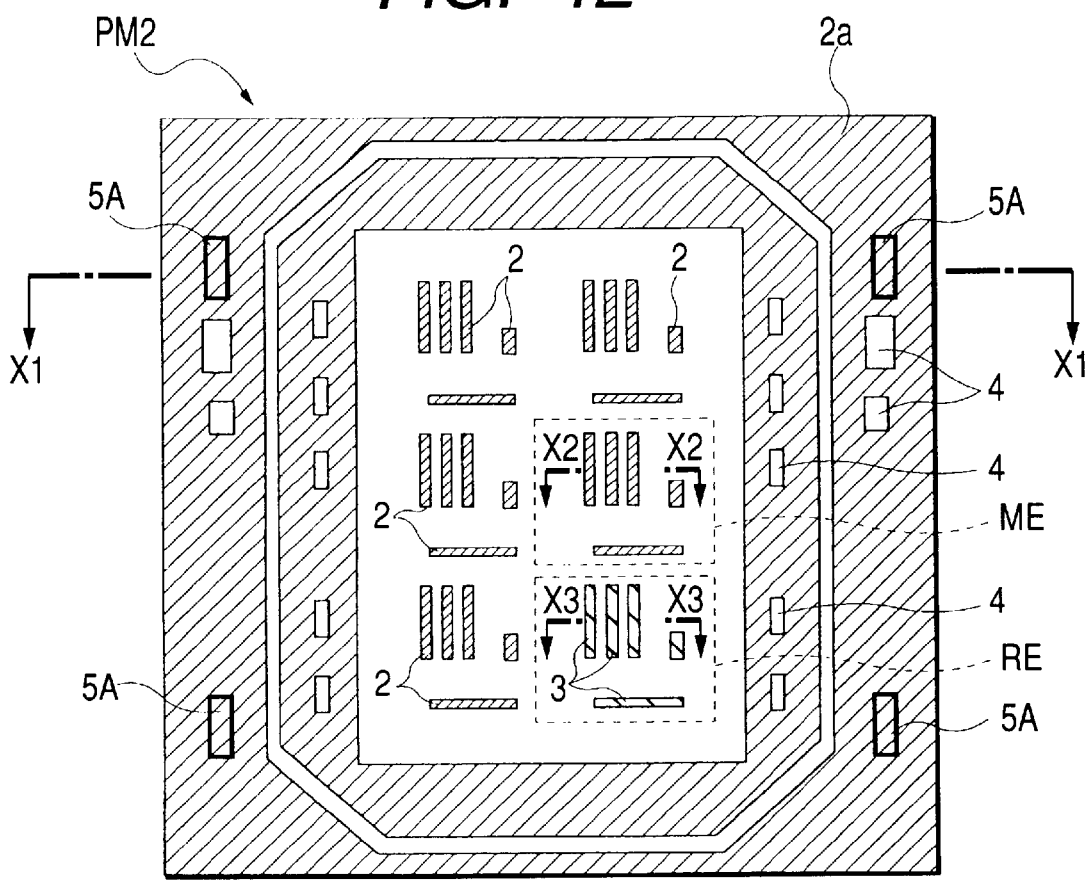
FIG. 12 is a plan view of a photomask used in the semiconductor integrated circuit device fabricating method.
Figure 13:
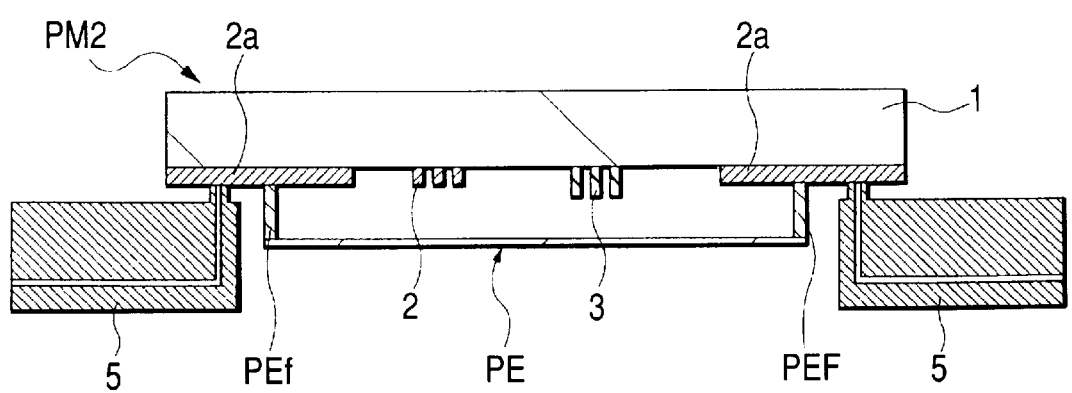
FIG. 13 is a sectional view taken on line X1—X1 in FIG. 12 with the photomask loaded onto a predetermined manufacturing apparatus.
Figure 14:
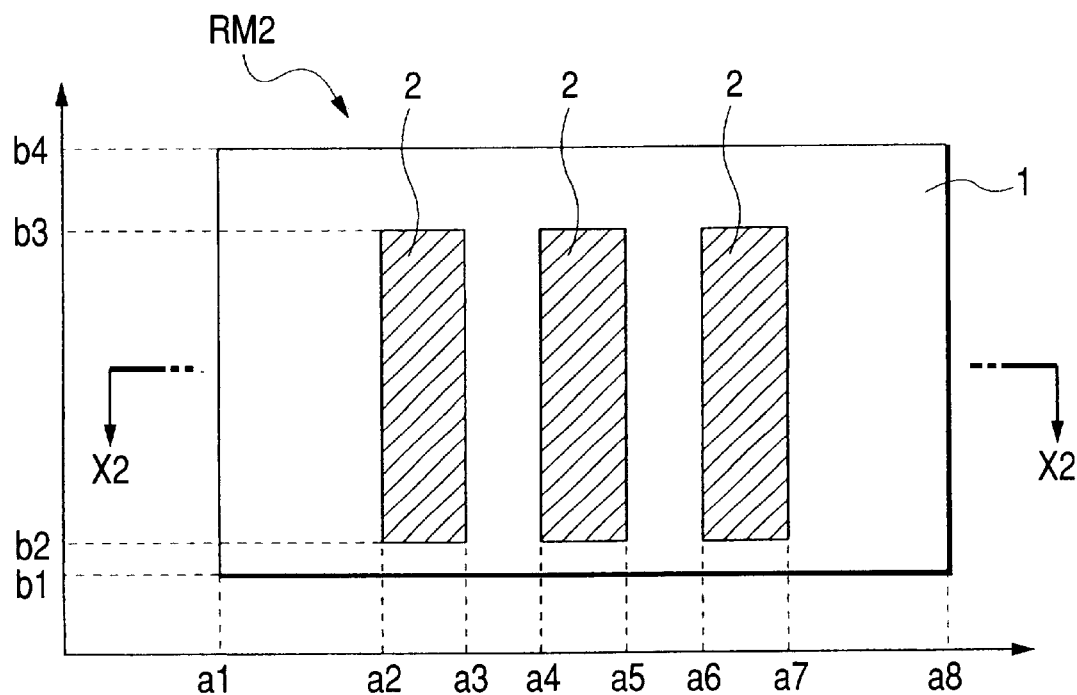
FIG. 14 is an enlarged plan view of a principal portion of an area ME in FIG. 12.
Figure 15:
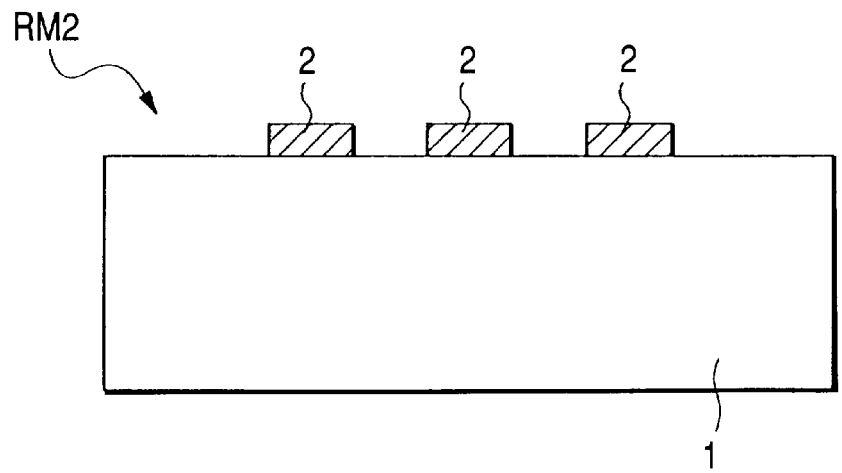
FIG. 15 is a sectional view taken on line X2—X2 in FIGS. 12 and 14.
Figure 16:
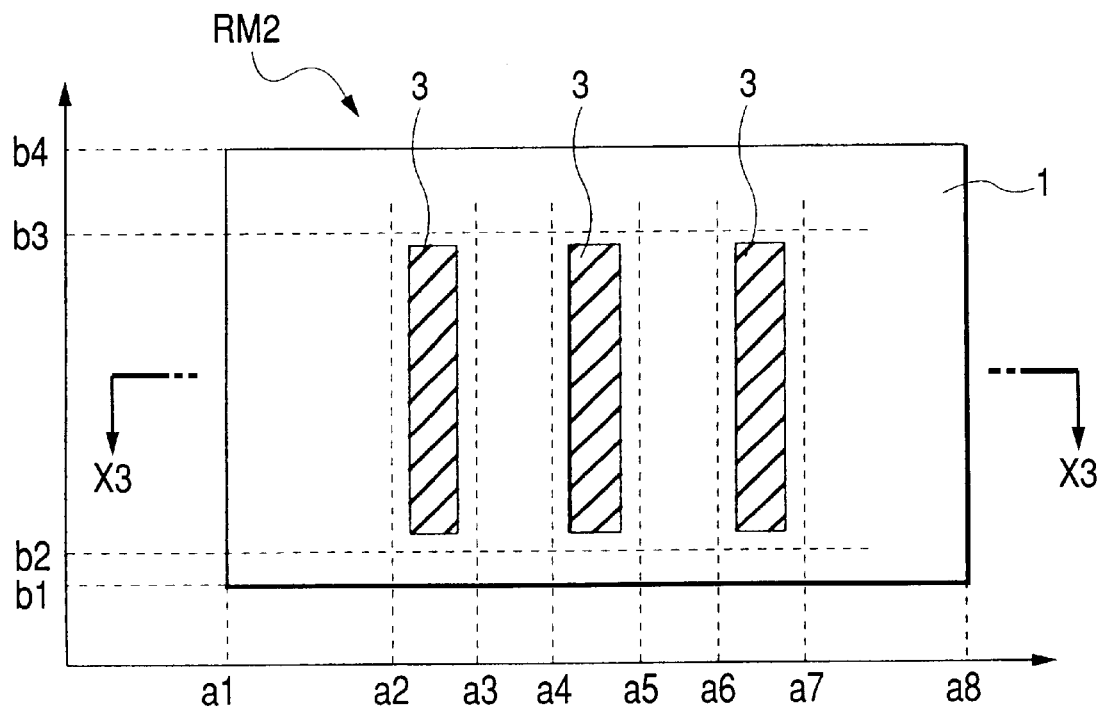
FIG. 16 is an enlarged plan view of a principal portion of an area RE in FIG. 12.
Figure 17:
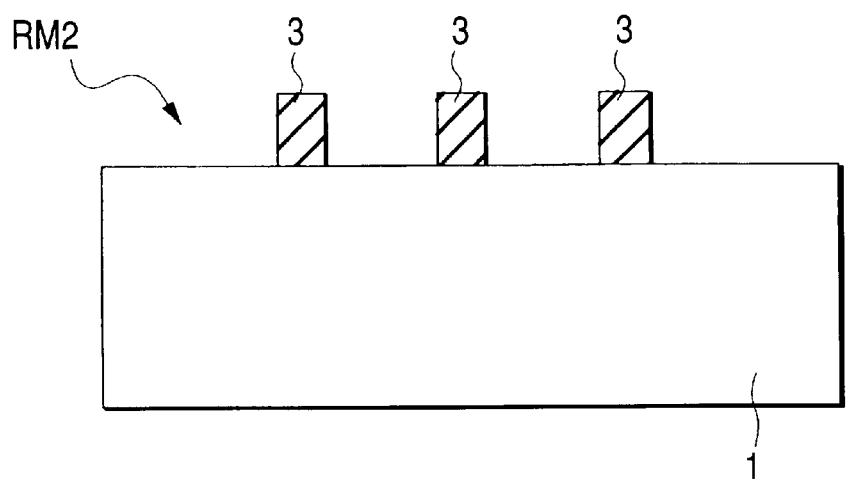
FIG. 17 is a sectional view taken on line X3—X3 in FIGS. 12 and 16.

FIG. 12 is a plan view of a mask embodying the present invention, FIG. 13 is a sectional view taken on line X1—X1 with the mask loaded onto a predetermined manufacturing apparatus, FIG. 14 is an enlarged plan view of a principal portion of an area ME shown in FIG. 12, FIG. 15 is a sectional view taken on line X2—X2 in FIG. 14, FIG. 16 is an enlarged plan view of a principal portion of an area RE shown in FIG. 12, and FIG. 17 is a sectional view taken on line X3—X3 in FIG. 12. In FIGS. 14 and 16 there are depicted coordinates for showing a relative dimensional difference between shielding patterns 2 and 3.

A resist mask RM2 used in this second embodiment is a reticle which is for focusing an original of an integrated circuit pattern having a size of one to ten times as large as an actual size onto a wafer through a reducing projection optical system and transferring it onto the wafer. With the illustrated mask, the peripheral portion of a semiconductor chip (simply "chip" hereinafter) becomes a light shielding portion and a line pattern is to be formed using a positive type resist film on the wafer.

A mask substrate 1 of the resist mask RM2 is formed, for example, by a transparent synthetic quartz glass sheet 6 mm or so in thickness which is square in plan. Centrally of a main surface (first surface) thereof is formed a light transmitting aperture area which is rectangular in plan and to which the main surface of the mask substrate is exposed. The light transmitting aperture area forms the foregoing transfer pattern area. In this transfer pattern area and on the main surface of the mask substrate 1 are arranged shielding patterns 2 and 3 for the transfer of integrated circuit patterns onto the wafer (all of the illustrated shielding patterns 2 and 3 function as the foregoing binary shielding patterns). That is, in this embodiment, the shielding patterns in area ME are formed by metal as is the case with the ordinary mask, while the shielding patterns 3 in area RE are formed by resist film. Therefore, it is possible to selectively remove only the shielding patterns 3 located in area RE from among all the shielding patterns 2 and 3 in the resist mask RM2 and form new shielding patterns 3 again in area RE. For this reason a new resist mask with partially changed mask patterns can be fabricated in a relatively simple manner and that in a short time. In the illustrated example, the shielding patterns 2 and 3 are transferred as line patterns onto the wafer.

In this second embodiment, a group of shielding patterns 2 formed by metal and located in area ME and a group of shielding patterns 3 formed by resist film and located in area RE, both formed on the same mask substrate 1, are patterns for the transfer of the same pattern (same size and same shape) on wafer, but are different in planar size for the same reason as that set forth in the previous first embodiment. More specifically, as shown in FIGS. 14 to 17, a correction is made for a planar size of each shielding pattern 3 formed by resist film in such a manner that the planar size is smaller uniformly by a predetermined value from the outer periphery side than that of a shielding pattern formed by a metallic film which is usually employed. Thus, it is smaller than the planar size of each metallic shielding pattern 2. As to replacing the resist mask thus partially having the shielding patterns 3 formed by resist film with the ordinary mask, it is the same as in the first embodiment, so an explanation thereof will here be omitted.

On the main surface of the mask substrate 1 the outer periphery of the transfer pattern area is covered with a shielding pattern 2a. The shielding pattern 2a is formed like a frame in plan so as to surround the transfer pattern area. For example, it is formed in the same patterning process and using the same metal as the shielding patterns 2. The material of the shielding patterns 2 and 2a is as described in the first embodiment, but no limitation is made thereto and various changes may be made. For example, there may be used a high melting metal such as tungsten, molybdenum, tantalum, or titanium, a nitride such as tungsten nitride, a high melting metal silicide (compound) such as tungsten silicide (WSix) or molybdenum silicide (MoSix), or a laminate film thereof. In the case of the resist mask RM2 of this embodiment there sometimes is a case where, after removing the shielding patterns 3 formed by resist film, the mask substrate 1 is washed and used again. Therefore, it is preferable that the shielding patterns 2 and 2a be formed of a material superior in resistance to peeling and to wear. A high melting metal such as tungsten is superior in resistance to oxidation, to wear, and to peeling, so is desirable as the material of the shielding patterns 2 and 2a.

On the shielding pattern 2a, the area surrounded with a generally octagonal frame corresponds to the pellicle cover area. In the illustrated example, a pellicle PE is bonded through a pellicle affixing frame PEF to the main surface (first surface) side of the mask substrate 1 of the resist mask RM2. The pellicle PE is a structure having a transparent protective film and is provided at a certain distance from the main surface or both main surface and back side of the mask substrate 1 for the purpose of, for example, preventing the adhesion of dust particles to the resist mask RM2. This certain distance is determined in consideration of dust particles deposited on the surface of the protective film and the transferability thereof onto the wafer. A base portion of the pellicle affixing frame PEF is bonded and fixed to the shielding pattern 2a of the resist mask RM2 in direct contact with the pattern 2a, whereby it is possible to prevent peeling of the pellicle affixing frame PEF. If resist film is formed at the position where the pellicle affixing frame PEF is mounted, the resist film will peel off and cause the generation of dust particles at the time of mounting and removal of the pellicle PE. By bonding the pellicle affixing frame PEF to the shielding pattern 2a in direct contact with the pattern 2a it is possible to prevent the generation of such dust particles. Part of the shielding pattern 2a is removed and various mark patterns 4, e.g., alignment marks, are formed in the removed portions. Thick frame areas 5A located near the four corners of the resist mask RM2 in FIG. 12 represent areas for contact with mounting portions 5 of an exposure unit or an inspection unit.

Figure 18:
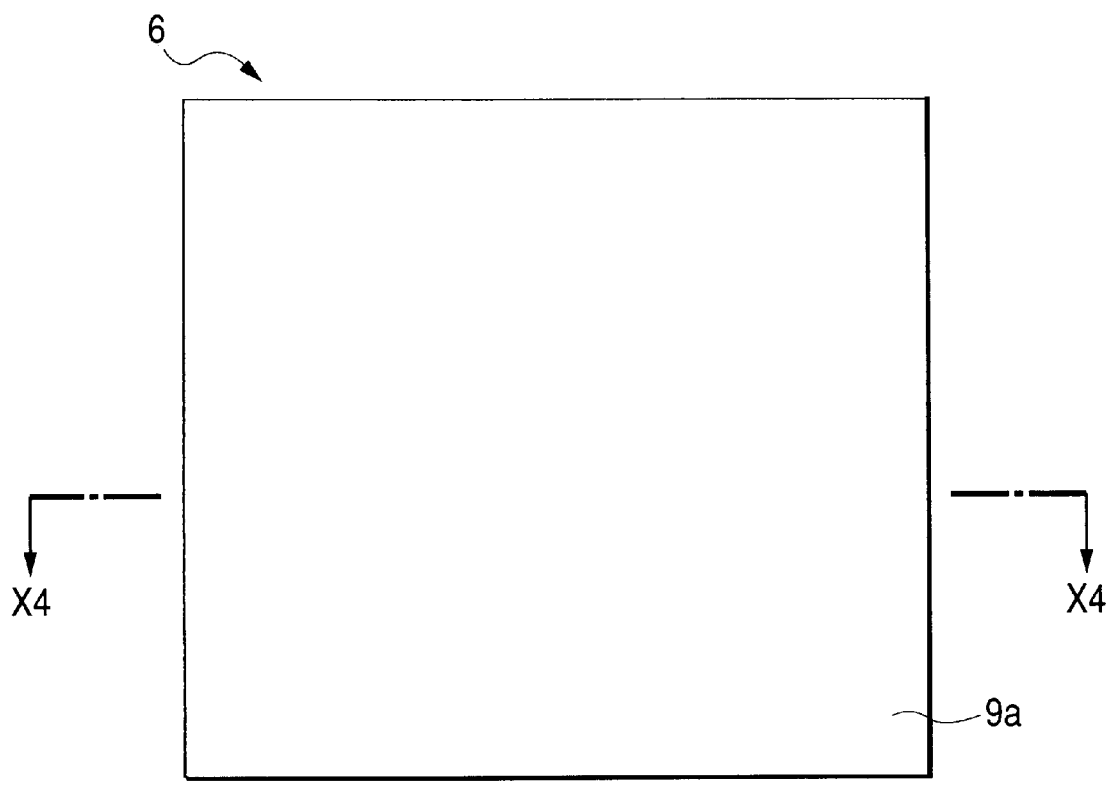
FIG. 18 is a plan view of a principal portion of wafer used in a semiconductor integrated circuit device fabricating method according to another embodiment of the present invention.
Figure 19:
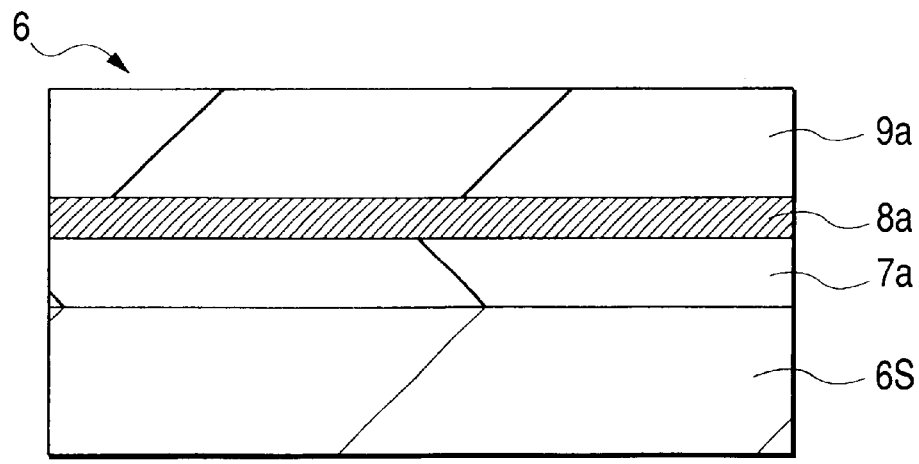
FIG. 19 is a sectional view taken on line X4—X4 in FIG. 18.

Using the resist mask RM2, patterns were transferred onto a wafer 6 shown in FIGS. 18 and 19 by means of a reducing projection exposure unit. FIG. 18 is a plan view of a principal portion of the wafer 6 and FIG. 19 is a sectional view taken on line X4—X4 in FIG. 18. A semiconductor substrate (simply "substrate" hereinafter) 6S of the wafer 6 which serves as a substrate to be projected is formed by a silicon single crystal for example. On a main surface of the substrate 6S are formed integrated circuit components such as MIS FET (Metal Insulator Semiconductor Field Effect Transistor). An insulating film 7a is deposited on the main surface of the substrate 6S so as to cover the integrated circuit components, and a conductor film 8a is deposited on the insulating film 7a so as to cover the whole of an upper surface of the insulating film. Further, an ordinary positive type resist film 9a having sensitivity to KrF for example is deposited at a thickness of 400 nm or so for example, on the conductor film 81.

As exposure light from the reducing projection exposure unit there was used KrF excimer laser beam as an example. Likewise, as the numerical aperture NA of a projection lens and a light source coherence (the sigma value) σ there were used 0.68 and 0.75, respectively. Alignment between the reducing projection exposure unit and the resist mask RM2 is performed by detecting the mark patterns 4 on the resist mask RM2. For the alignment there was used, as an example, light having a longer wavelength than the exposure wavelength such as helium-neon (He—Ne) laser beam having a wavelength of 633 nm. Thus, even in case of using a longer wavelength light than the exposure wavelength as alignment light, a sufficient contrast of light having passed through the mark patterns 4 is ensured and therefore a relative positioning between the resist mask RM2 and the exposure unit could be done easily and that with a high accuracy.

Figure 20:
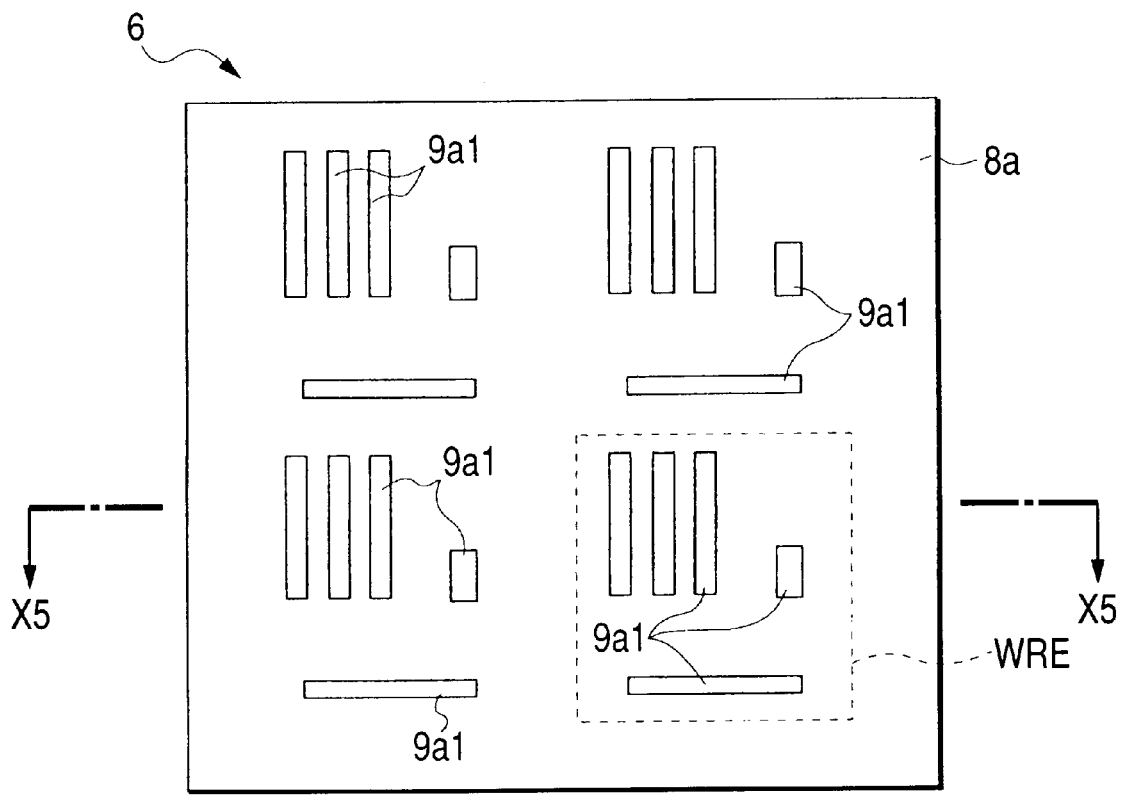
FIG. 20 is a plan view of the wafer in a manufacturing step which follows FIGS. 18 and 19.
Figure 21:
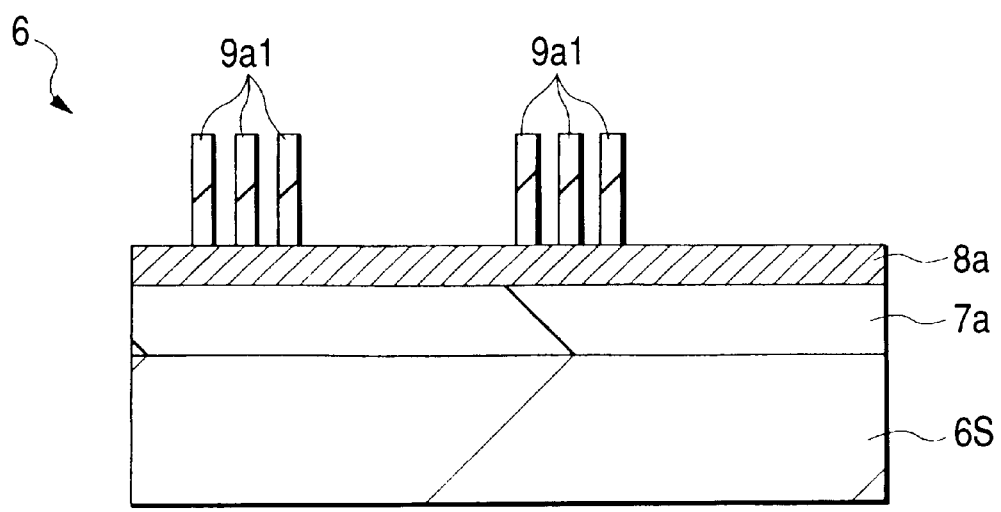
FIG. 21 is a sectional view taken on line X5—X5 in FIG. 20.

Thereafter, the integrated circuit patterns on the resist mask RM2 were reductionwise projected onto a main surface of the wafer 6 by a conventional exposure method, followed by conventional heat treatment and developing step to form resist patterns 9a1 shown in FIGS. 20 and 21. FIG. 20 is a plan view of a principal portion of the wafer 6 and FIG. 21 is a sectional view taken on line X5—X5 in FIG. 20. An area WRE represents an area in which shielding patterns 3 formed by resist film have been transferred. The other area is an area in which shielding patterns 2 formed by metal have been transferred.

Figure 22:
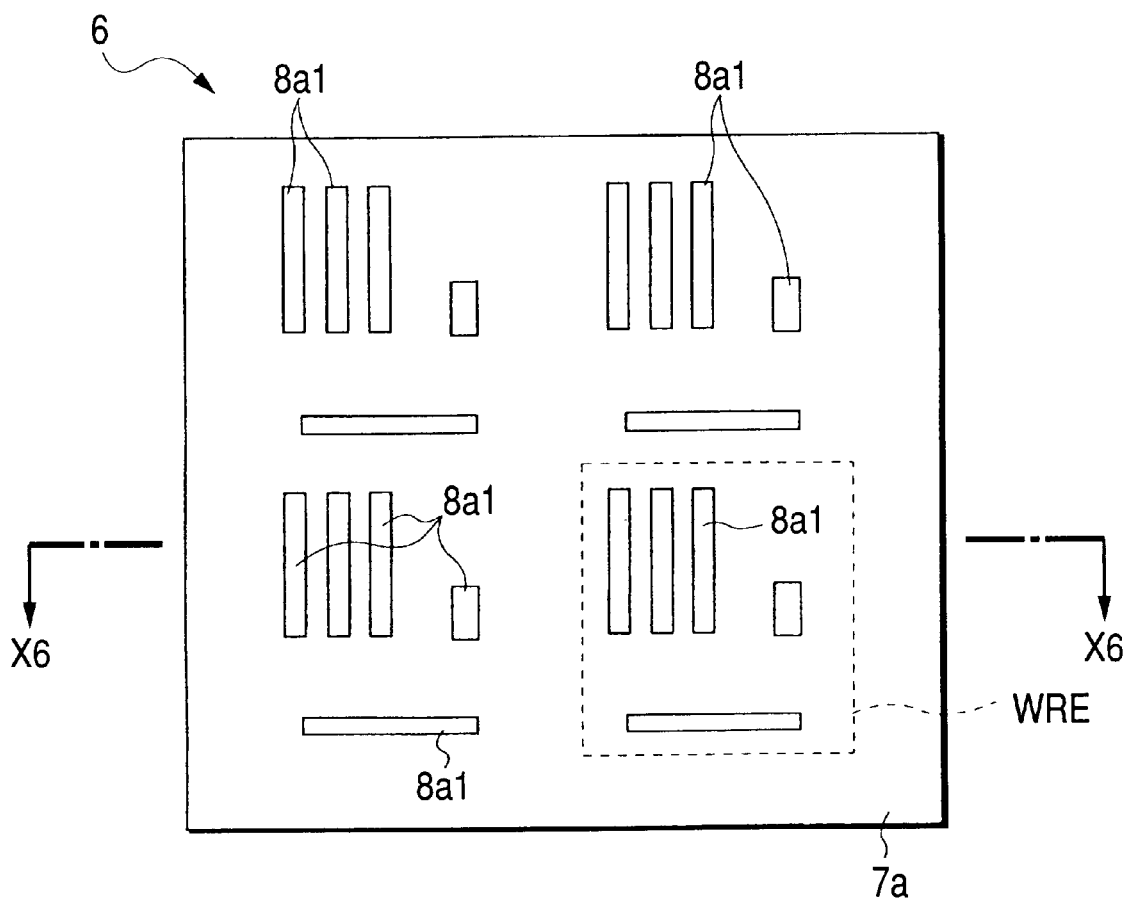
FIG. 22 is a plan view of a principal portion of the wafer in a manufacturing step which follows FIGS. 20 and 21.
Figure 23:
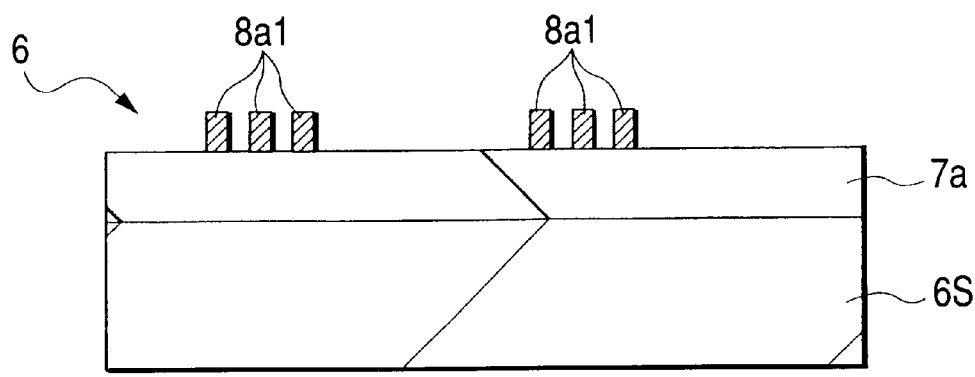
FIG. 23 is a sectional view taken on line X6—X6 in FIG. 22.

Thereafter, the conductor film 8a was etched using the resist patterns 9a1 as etching masks to form conductor film patterns 8a1 as shown in FIGS. 22 and 23. FIG. 22 is a plan view of a principal portion of the wafer 6 and FIG. 23 is a sectional view taken on line X6—X6 in FIG. 22. As a result, there was obtained about the same pattern transfer characteristic as in the exposure using the ordinary mask. The length and width of each conductor film pattern 8a1 and the spacing (or pitch) between adjacent patterns 8a1 are equal between the area WRE and the other area.

The following description is now provided about a method for partially modifying or changing patterns in a semiconductor integrated circuit device with use of the resist mask RM2 used in the second embodiment. In a development phase or during manufacture of a semiconductor integrated circuit device there sometimes occurs a case where an integrated circuit pattern is required to be partially modified or changed. With the ordinary mask, a new mask substrate is provided and a metal film is deposited thereon and is patterned, so the work for modifying or changing the pattern is a troublesome work requiring labor and time. Besides, if a mask pattern fabricated should include a defect, the mask is generally unemployable though the use/non-use decision depends on the degree of the defect and there is no choice but to discard the mask if found to be defective. In this case, it is necessary to provide a new mask substrate and again fabricate the mask from the beginning, which work may be wasteful and uneconomical.

Figure 24:
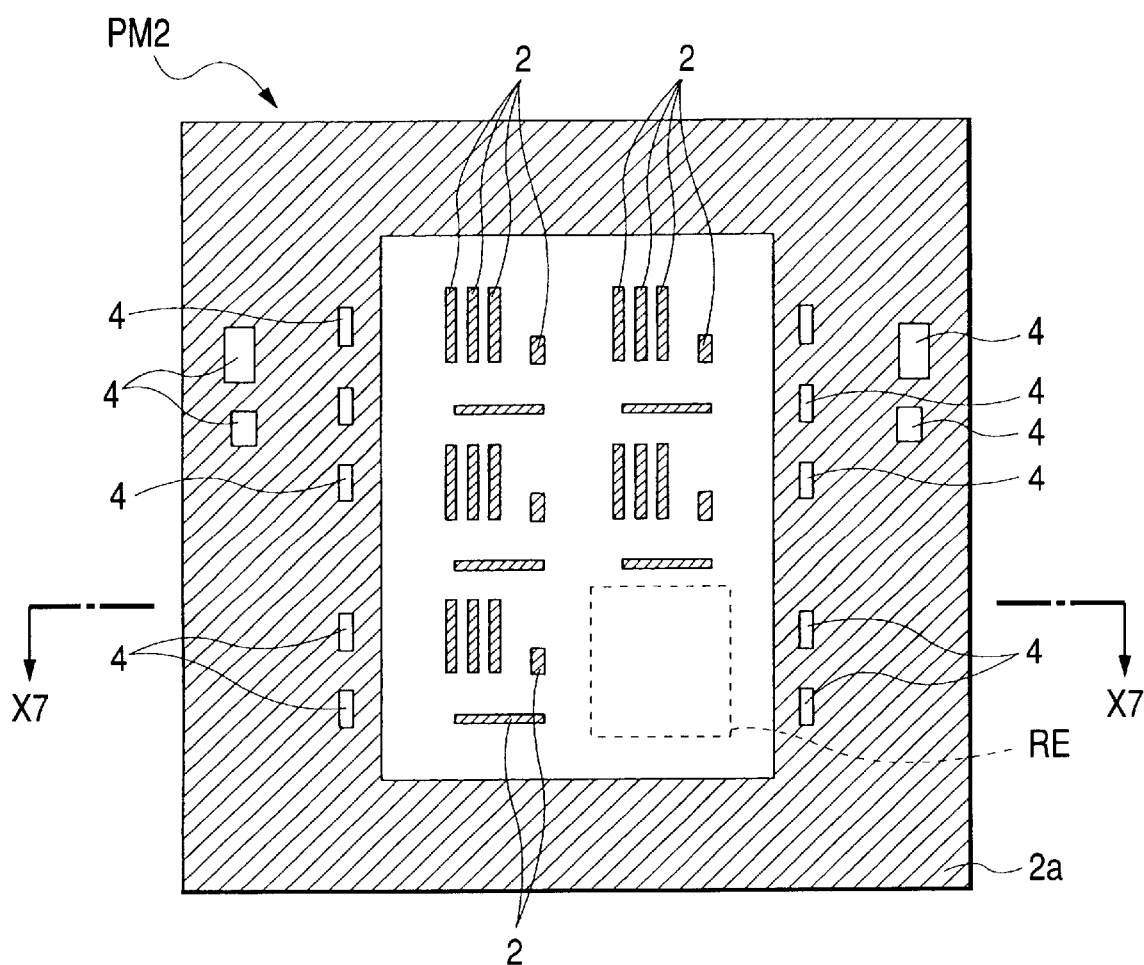
FIG. 24 is a plan view of a resist mask after removal of shield patterns formed by resist films.
Figure 25:
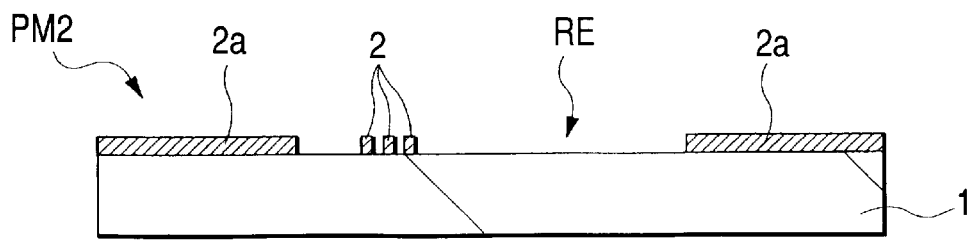
FIG. 25 is a sectional view taken on line X7—X7 in FIG. 24.

On the other hand, in case of using the resist mask RM2 according to this second embodiment, it is possible to take the following countermeasure. First, the shielding patterns 3 formed by the resist film of resist mask RM2 in FIG. 12 are removed as in FIGS. 24 and 25. FIG. 24 is a plan view of the resist mask RM2 after removal of the shielding patterns 3 and FIG. 25 is a sectional view taken on line X7—X7 in FIG. 24. In the resist mask RM2, there remain metallic shielding patterns 2 and 2a, but the shielding patterns 3 in area RE have been removed.

The shielding patterns 3 formed by resist film have been removed with an n-methyl-2-pyrrolidone organic solvent as an example. A heated amine-based organic solvent or acetone may be used for removing the shielding patterns 3. For the same purpose there also may be used an aqueous tetramethylammonium hydroxide (TMAH) solution, ozone sulfuric acid, or a mixture of aqueous hydrogen peroxide and concentrated sulfuric acid. The use of an aqueous TMAH solution is preferred because a concentration thereof of about 5% permitted removal of the resist film (shielding patterns 3) without soaking of metal (shielding patterns 2 and 2a). As a further method for removing the resist film (shielding patterns 3) there may be adopted an oxygen plasma ashing method. This method is effective particularly in the case where the resist film (shielding patterns 3) on the resist mask RM2 has been subjected to a hardening treatment. This is because the resist film (shielding patterns 3) having been subjected to a hardening treatment is in a hardened state and so there occurs a case where the above chemical methods cannot remove the resist film to a satisfactory extent. The shielding patterns 3 may be removed mechanically by peeling. According to this mechanical method, an adhesive tape is affixed to each of shielding patterns 3-formed surface portions of the resist mask RM2 and is then peeled off to remove the shielding patterns 3.

Figure 26:
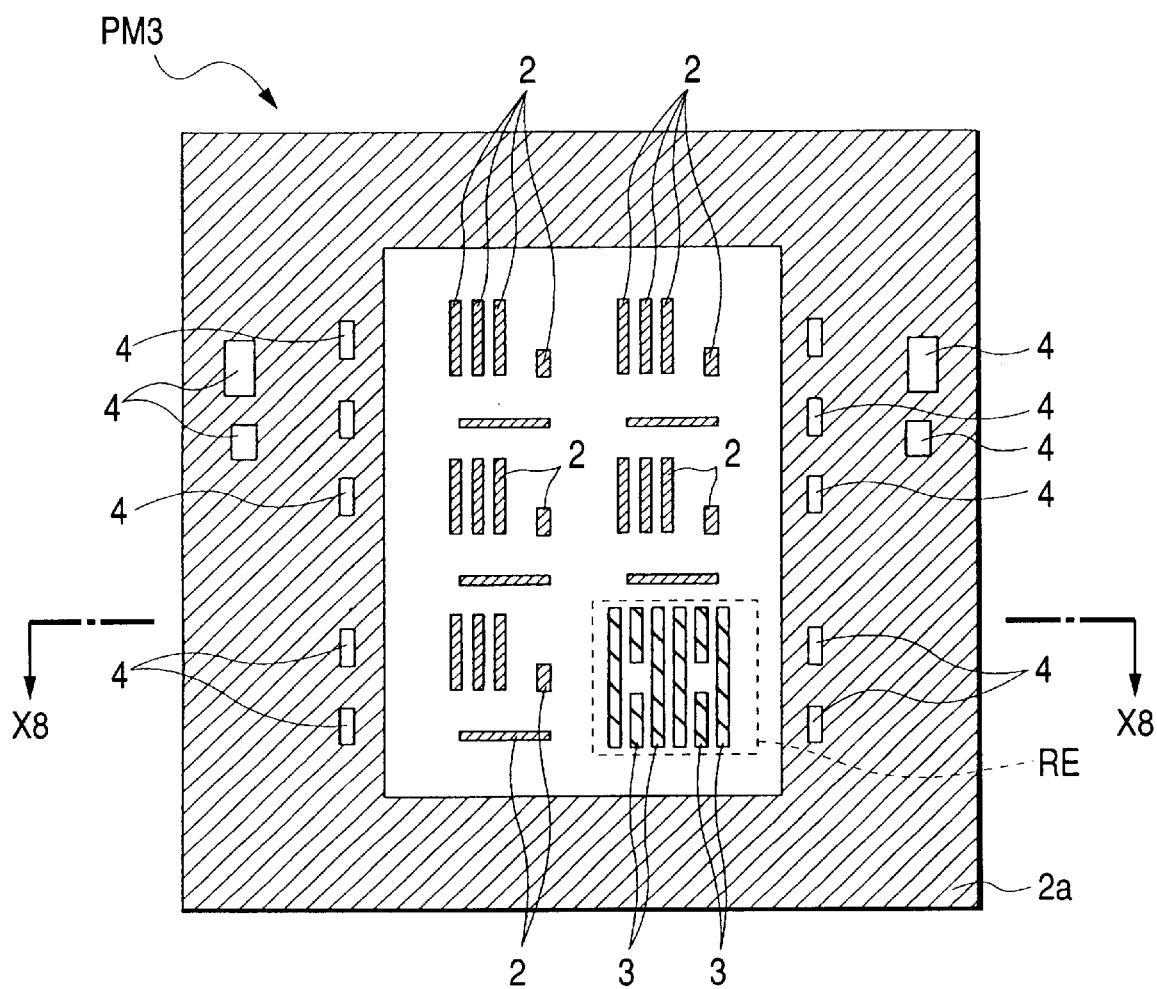
FIG. 26 is a plan view of a resist mask newly fabricated.
Figure 27:
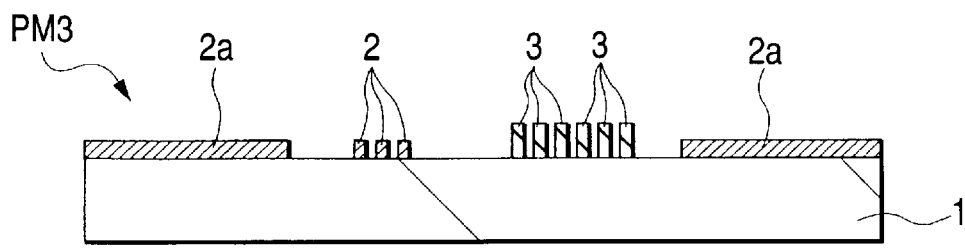
FIG. 27 is a sectional view taken on line X8—X8 in FIG. 26.

The step of removing the resist film (shielding patterns 3) is followed by a washing step to remove dust particles present on the surface of the resist mask RM2. In this washing step there was used a combination of ozone sulfuric acid washing and brush washing, but no limitation is made thereto and various changes may be made insofar as the method adopted has a high ability to remove dust particles and does not cause soaking of metal (shield patterns 2 and 2a). Thereafter, an electron beam-sensitive resist film (e.g., a novolak type resist film) having a property of absorbing an exposure light such as KrF excimer laser beam, ArF excimer laser beam, or $F^2$ laser beam is formed by a spin coating method onto the main surface of the mask substrate 1 shown in FIGS. 24 and 25. Then, using the same electron beam plotting method as the desired pattern forming method used in the ordinary mask manufacturing process, a group of desired shielding patterns 3 different in shape from a group of shielding patterns 3 shown in area RE in FIG. 12 were formed in area RE by resist film to fabricate a new resist mask RM3, as shown in FIGS. 26 and 27. FIG. 26 is a plan view of the new resist mask RM3 and FIG. 27 is a sectional view taken on line X8—X8 in FIG. 26. In such an electron beam plotting process, for generating data on the new shielding patterns 3 formed by resist film on the basis of data on the metallic shielding patterns, it is necessary to make such a dimensional correction as described in the first embodiment. That is, in the same way as above, a planar size of each shielding pattern formed by resist film is set smaller than that of each metallic shielding pattern to be formed, whereby resist patterns of a desired size can be transferred onto the wafer.

Figure 28:
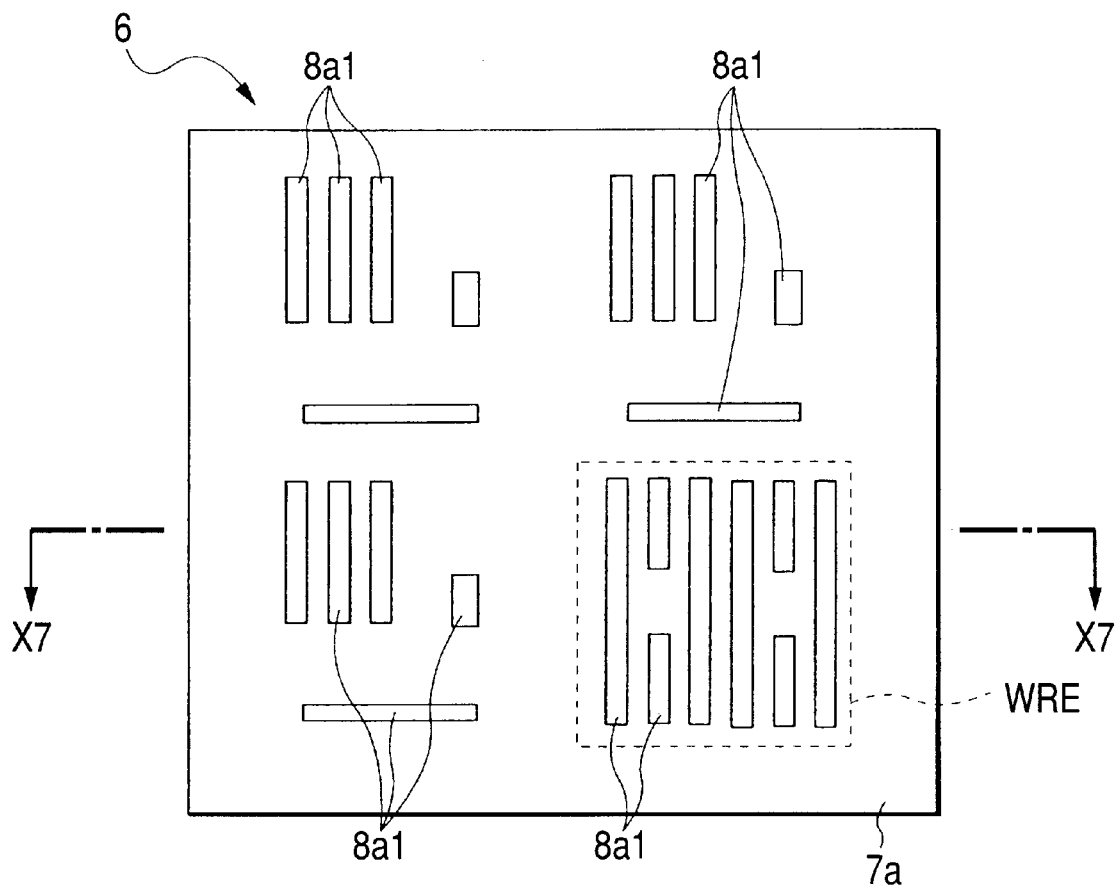
FIG. 28 is a plan view of a principal portion of a wafer, showing patterns which have been transferred onto the wafer with use of the resist mask illustrated in FIGS. 26 and 27.
Figure 29:
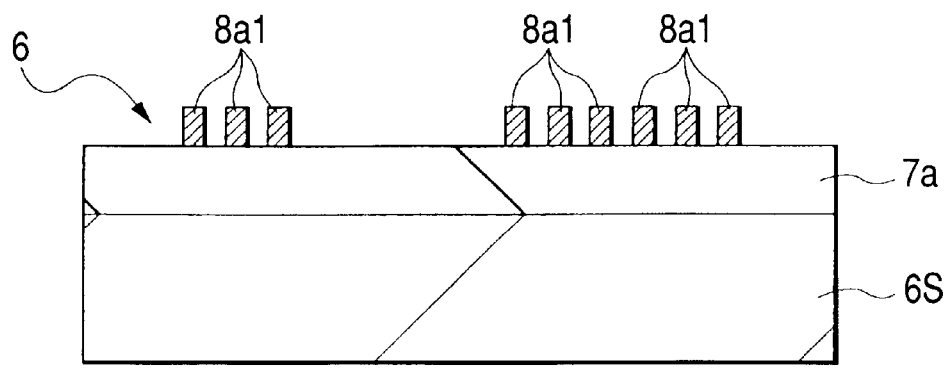
FIG. 29 is a sectional view taken on line X7—X7 in FIG. 28.

FIGS. 28 and 29 illustrate conductor film patterns 8a1 which have been formed by reducing projection exposure of patterns of the resist mask RM3. FIG. 28 is a plan view of a principal portion of the wafer 6 and FIG. 29 is a sectional view taken on line X7—X7 in FIG. 28. In this way a group of conductor film patterns 8a1 of a shape different from that shown in FIGS. 22 and 23 can be formed on the main surface of the wafer 6.

Thus, in the resist masks RM2 and 3 according to this embodiment, if there occurred the necessity of modifying or changing partial (area RE) patterns due to having formed some shielding patterns 3 by resist film, all that is required is to remove the shielding patterns 3 and again form shielding patterns 3 in the same manner as the photolithography generally performed in the semiconductor integrated circuit device manufacturing process and re-form shielding patterns 3. Therefore, the modification and change can be done in a simple manner and that in an extremely short time. That is, it becomes possible to greatly shorten the mask fabricating period. Consequently, by using this mask in the development and manufacture of a semiconductor integrated circuit device it becomes possible to greatly shorten the time required for the development and manufacture of a semiconductor integrated circuit device. As to the technique for fabricating a semiconductor integrated circuit device using a mask wherein some shielding patterns are thus formed by resist film, it is described, for example, in Japanese Patent Application Nos. 2000-206728 and 2000-206729 (both filed Jul. 7, 2000) which includes an inventor in the present case.

Although the present invention has been described above concretely by way of embodiments thereof, it goes without saying that the invention is not limited to those embodiments and that various changes may be made within the scope not departing from the gist of the invention.

For example, although the semiconductor integrated circuit substrate used in the above embodiments is a semiconductor substrate constituted by a semiconductor alone, no limitation is made thereto and there may be used, for example, an SOI (Silicon On Insulator) substrate comprising an insulating layer and a thin semiconductor layer formed thereon or an epitaxial substrate comprising a semiconductor substrate and an epitaxial layer formed thereon.

Moreover, although in the above embodiments it is KrF that is used mainly as exposure light, no limitation is made thereto, but there may be used, for example, i-line (wavelength 365 nm) as exposure light. Also in this case shielding patterns formed by resist film tend to thicken, it is possible to apply the same means as in the above embodiments and there can be obtained the same effect. Also in case of using a short wavelength light such as ArF (wavelength 193 nm) or $F_2$ (wavelength 157 nm) as exposure light, it is possible to adopt the techniques described in the above first and second embodiments, whereby there can be obtained the same effects as in those embodiments. Besides, since the thickness of shielding patterns formed by resist film can be made smaller than in the use of i-line or KrF, it is possible to form finer patterns on the mask substrate and finer patterns can be formed on wafer.

Further, although a binary mask was mainly used in the above embodiments, there is made no limitation thereto. For example, the techniques described in the above first and second embodiments may be applied to a phase shift mask, especially a halftone mask (including a halftone film from resist film and a halftone film from an inorganic material). With such a halftone mask, there can be obtained an effect that the resist film functioning as a halftone film can be made thin, in addition to the effects obtained in the above first and second embodiments. Consequently, it is possible to form finer patterns on the mask substrate and wafer and make the mask machining work easier.

Further, although in the above embodiments reference has been made to the transfer and processing of line patterns, no limitation is made thereto, but the same techniques as above are also applicable to the transfer and processing of hole patterns.

Although the present invention has been described above mainly in its application to the fabrication method for a semiconductor integrated circuit device which is a background application field of the invention, no limitation is made thereto, but the invention is also applicable effectively to the manufacture of, for example, superconducting devices, micromachines, magnetic heads, electronic devices, and liquid crystal panels.

The following is a brief description of an effect obtained by a typical invention disclosed herein.

In connection with replacing a photomask with a shield member formed by a metal film and a photomask with a shield member formed by a photosensitive organic film from one to the other, there are adopted a step of adding a dimensional correction responsive to exposure conditions to a planar size of the shield member formed by the metallic film or the shield member formed by the photosensitive organic film and a step of reducing projection exposure of predetermined patterns to wafer with use of the photomask after the correction. By so doing, it becomes possible to improve the accuracy of patterns of a semiconductor integrated circuit device transferred onto the wafer.

What is claimed is:

1. A method of fabricating a semiconductor integrated circuit device, comprising the steps of:
   (a) providing a first photomask having a first light-shielding film having a first thickness, said first light-shielding film having first light-transmitting portions and first light-shielding portions arranged to produce a first predetermined projected exposure pattern corresponding to an integrated circuit, said first light-shielding portions having first transverse dimensions;
   (b) making a projection exposure through said first photomask onto a first photosensitive substrate;
   (c) providing a second photomask having a second light-shielding film having a second thickness different from said first thickness, said second light-shielding film having second light-transmitting portions and second light-shielding portions arranged to produce a second predetermined projected exposure pattern corresponding to said integrated circuit, said second light-shielding portions having second transverse dimensions different from said first transverse dimensions; and
   (d) making a projection exposure through said second photomask onto a second photosensitive substrate;
      wherein said second transverse dimensions are selected such that said second photomask produces essentially the same projection exposure pattern as said first photomask.

2. The method according to claim 1, wherein said projection exposures are made using a KrF excimer laser beam having a wavelength of 248 nm as a light source.

3. The method according to claim 1, wherein said photosensitive substrates are photoresist-coated semiconductor wafers.

4. The method according to claim 3, wherein in a first operation where the production volume is relatively large there is performed a reducing projection exposure process using the photomask with the shield member formed by a metallic film, while in a second operation where the production volume is smaller than in the first operation there is performed a reducing projection exposure process using the photomask with the shield member formed by a photosensitive organic film.

5. The method according to claim 3, wherein said projection exposures are made using a KrF excimer laser beam having a wavelength of 248 nm.

6. The method according to claim 1, wherein said second light-shielding film is an organic film.

7. The method according to claim 6, wherein said first light-shielding film is a metallic film.

8. A method according to claim 1, for fabricating a semiconductor integrated circuit device, comprising the steps of:
   (b1) after step (b), inspecting a first pattern produced by said first projection exposure;
   (b2) if said first pattern does not meet a predetermined criterion, repeating steps (a) through (c), with adjustments to said first transverse dimensions, until said first projection exposure meets said predetermined criterion, and thereafter performing steps (c) and (d).

9. The method according to claim 8, wherein steps (a) to (b2) are mask debugging steps, and steps (c) to (d) are steps of mass-producing the semiconductor integrated circuit device.

10. The method according to claim 8, wherein said projection exposures are made using a KrF excimer laser beam having a wavelength of 248 nm as a light source.

11. The method according to claim 8, wherein each first light-shielding film is organic, and said second light-shielding film is inorganic.

12. The method according to claim 8, wherein said second light-shielding film is a metallic film.

13. A method of fabricating a semiconductor integrated circuit device, comprising the steps of:
   (a) transferring a pattern onto a first photoresist layer over a semiconductor substrate by a reducing projection exposure process using a first photomask having an inorganic first light-shielding film having a first thickness, said first light-shielding film having first light-transmitting portions and first light-shielding portions arranged to produce a first predetermined projected exposure pattern corresponding to an integrated circuit, said first light-shielding portions having first transverse dimensions; and
   (b) transferring a second pattern onto a second photoresist layer over the semiconductor substrate by a reducing projection exposure process using an organic second light-shielding film having a second thickness greater than said first thickness, said second light-shielding film having second light-transmitting portions and second light-shielding portions arranged to produce a second predetermined projected exposure pattern corresponding to said semiconductor integrated circuit,
      wherein for a given pattern dimension on said semiconductor substrate said second light-shielding portions have second transverse dimensions smaller than said first transverse dimensions of said first light-shielding portions of said first light-shielding film.

14. The method according to claim 13, wherein said projection exposures are made using a KrF excimer laser beam having a wavelength of 248 nm.

15. The method according to claim 13, wherein said first light-shielding film is a metallic film.

16. A method of fabricating an integrated circuit device, comprising the steps of:
   transferring a predetermined pattern onto a photosensitive substrate by a reducing projection exposure process using a photomask having first and second mask regions;
   said first mask region having a first light-shielding film comprising an inorganic film having a first thickness, said first light-shielding film having first light-transmitting portions and first light-shielding portions arranged to produce a first predetermined projected exposure pattern corresponding to a first portion of an integrated circuit, said first light-shielding portions having first transverse dimensions;
   said second mask region having a second light-shielding film comprising an organic film having a second thickness greater than said first thickness, said second-light-shielding film having second light-transmitting portions and second light-shielding portions arranged to produce a second predetermined projected exposure pattern corresponding to a second portion of the integrated circuit,
   wherein for a given pattern dimension on the substrate, said second light-shielding portions have second transverse dimensions smaller than said first transverse dimensions of said first light-shielding portions of said first mask region.

17. The method according to claim 16, wherein said projection exposures are made using a KrF excimer laser having a wavelength of 248 nm as a light source.

18. The method according to claim 16, wherein said first light-shielding film is a metallic film.

* * * * *